(12) United States Patent
Sudo et al.

(10) Patent No.: US 7,602,875 B2
(45) Date of Patent: Oct. 13, 2009

(54) SAMPLING RATE CONVERSION METHOD AND APPARATUS

(75) Inventors: Eiji Sudo, Kanagawa (JP); Yasushi Ooi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 620 days.

(21) Appl. No.: 11/041,239

(22) Filed: Jan. 25, 2005

(65) Prior Publication Data
US 2005/0163276 A1    Jul. 28, 2005

(30) Foreign Application Priority Data
Jan. 28, 2004    (JP)    ............................... 2004-020496

(51) Int. Cl.
*H04L 25/40*    (2006.01)
*H04L 23/00*    (2006.01)
(52) U.S. Cl. ...................................... 375/372; 375/377
(58) Field of Classification Search ......... 375/371–373, 375/376, 377; 711/100, 200
See application file for complete search history.

(56) References Cited
U.S. PATENT DOCUMENTS 4,860,283 A * 8/1989 Takano et al. ............... 370/470
5,222,108 A * 6/1993 Suzuki ........................ 375/372
5,822,327 A * 10/1998 Satou .......................... 370/505
2001/0014066 A1 * 8/2001 Koudo et al. ............. 369/47.45

FOREIGN PATENT DOCUMENTS
JP    11-112440    4/1999

* cited by examiner

*Primary Examiner*—Tesfaldet Bocure
(74) *Attorney, Agent, or Firm*—McGinn IP Law Group, PLLC

(57) ABSTRACT

A sampling apparatus for converting first data, sampled at a first sampling rate, into second data, sampled at a second sampling rate. A FIFO storing the first data based on a write control signal and outputs the second data read out based on a read control signal indicating whether the second data is to be read out during the next time interval. The apparatus further includes a frequency detection unit for measuring the first clock signal during the current time interval to generate the value of the first current clock frequency, generating the value of a current predicted clock frequency from the value of the first current clock frequency and the value of the directly previously predicted clock frequency and for using the value of the current predicted clock frequency as the directly previously predicted clock frequency during the next time interval. A calculating unit generates the write control signal and read control signal from the value of a second current frequency, generated by measuring the second clock signal during the current time interval, to output the write and read control signal to the FIFO.

29 Claims, 15 Drawing Sheets

SAMPLING RATE CONVERSION METHOD AND APPARATUS

FIELD OF THE INVENTION

This invention relates to a sampling rate conversion apparatus and, more particularly, to a method and an apparatus for converting the sampling rates between two sampling rates employing two clocks differing in both the frequency and the generating sources.

BACKGROUND OF THE INVENTION

There has so far been known a technique in which, when converting a speech data signal as an analog signal, into a digital signal, by way of AD conversion, the speech data signal is sampled a preset number of times per preset time to digitize the speech data signal. In the case of speech signal, the higher the sampling frequency, the higher may be the pitch of the sound that may be recorded, such that up to the frequency component corresponding to one-half the sampling rate can be completely restored to the original analog signal.

Since the lower the sampling rate, the smaller may be the amount of data, there are occasions where, depending on the analog signal sampled, it is efficacious to record signal from the sound source as digital data at a low sampling rate. If a speech signal, digitized at a given sampling rate, is reproduced on an apparatus not coping with the sampling rate, the signal cannot be reproduced because of the difference in the sampling rate. For eliminating this inconvenience, there is known such a technique for converting a speech signal, digitized at a certain sampling rate, into a digital speech signal of a different sampling rate (see the Patent Document 1, as an example).

FIG. 1 depicts a block diagram showing the configuration of a sampling rate conversion apparatus, described in the Patent Document 1. In the sampling rate conversion between two clocks which are different in clock frequencies, shown in FIG. 1, the respective clock frequencies are dynamically changed in dependence upon temperature drift or jitter characteristic of an oscillator. In this sampling rate conversion apparatus, the frequency ratio R of the input and output clocks is calculated by a frequency detection unit J2 and, based on the result calculated, the sampling rate is converted by an fs conversion calculating unit J1. The frequency ratio R is found based on a count value of the rising edges of the input clock signal, with the output clock signal as a reference, that is, based on actual measured value.

The frequency detection unit J2, by itself, cannot cope with moderate change in the input clock frequency, thus leading to accumulated error, as a result of which underrun or overrun tends to be produced in the FIFO (First In First Out) J3. Hence, a margin detection unit J6 is provided to feed back the state of the FIFO J3 to the fs conversion calculating unit J1 to prevent underrun or overrun from occurring in the FIFO J3.

In the technique disclosed in Patent Document 1, a correction unit J5 is controlled from two places, namely the frequency detection unit J2 and the margin detection unit J6. On the other hand, with the configuration shown in FIG. 1, control from the margin detection unit J6 to the fs conversion calculating unit J1 is by a feedback loop. Such configuration tends to produce an unstable circuit operation. In addition, the apparatus is increased in size because it is necessary to provide circuit blocks, such as correction data generating unit J4, correction unit J5 or margin detection unit J6.

Hence, a sampling rate conversion apparatus, simplified in structure and high in operating accuracy, as the underrun or overrun in the FIFO J3 is prevented from occurrence, has been a desideratum.

[Patent Document 1]
Japanese Patent Kokai Publication No. JP-A-11-112440.

SUMMARY OF THE DISCLOSURE

In view of the above-depicted status of the art, it is an object of the present invention to provide a sampling rate conversion apparatus and a sampling rate conversion method by means of which conversion may be made to a high accuracy between two sampling rates which are based on two clocks differing in the frequency and in the generation sources.

It is another object of the present invention to provide a sampling rate conversion apparatus formed by a simplified circuit.

The above and other objects are attained by a sampling rate conversion apparatus for converting first data, sampled at a first sampling rate, into second data, sampled at a second sampling rate, in accordance with one aspect of the present invention, comprises:

a FIFO for storing said first data responsive to a first clock signal and for outputting said first data as second data responsive to a second clock signal; said FIFO storing said first data based on a write control signal indicating whether or not said first data written directly previously is to be updated to said first data; said FIFO outputting the second data read out based on a read control signal indicating whether or not the second data as read out is to be read out during the next time interval as well; and a calculating unit for generating the write control signal and the read control signal from the value of a second current clock frequency for the current time interval and from the value of a current predicted clock frequency to output the write control signal and the read control signal value thus generated to said FIFO; wherein the value of said second current clock frequency value is a measured value of said a second clock signal for the current time interval; and wherein the value of said current predicted clock frequency represents a predicted value of the frequency of said first clock signal during the current time interval.

A sampling rate conversion method for converting first data, sampled at a first sampling rate, into second data, sampled at a second sampling rate, in accordance with another aspect of the present invention, comprises the steps of:

storing said first data responsive to a first clock signal;

outputting said first data as second data responsive to said a second clock signal;

storing said first data, written directly previously, based on a write control signal indicating whether or not said first data is to be updated to said first data;

reading out the second data based on a read control signal indicating whether or not said second data as read out is to be read out for the next time interval as well; and generating said write control signal and said read control signal from the value of a second current clock frequency, as a measured value of the frequency of said second clock signal for the current time interval, and from the value of the current predicted clock frequency representing a predicted value of the frequency of said first clock signal.

In the following, means for solving the problem are explained using symbols or terms as used in the 'best mode for carrying out the invention'. These symbols or terms have been added in order to clarify the relationship of correspondence between the description of the 'claims' and that of the 'best mode for carrying out the invention', provided that these symbols or terms should not be used for interpreting the technical scope of the invention as stated in the 'claims'.

For effecting sampling rate conversion, according to the present invention, such a sampling rate conversion apparatus for converting first data, sampled at a first sampling rate, into second data, sampled at a second sampling rate, may be used, which comprises a FIFO (3) for storing the first data responsive to a first clock signal (clk1) and for outputting the first data as second data responsive to the second clock signal (clk2), with the FIFO storing the first data based on a write control signal (disable flag) indicating whether or not the first data written directly previously is to be updated to the first data, and with the FIFO outputting the second data read out based on a read control signal (hold flag) indicating whether or not the second data as read out is to be read out during the next time interval as well, and a calculating unit (1) for generating the write control signal and the read control signal value from the value of the second current clock frequency for the current time interval and the value of the current predicted clock frequency (f(i)) to output the write control signal (disable flag) and the read control signal (hold flag) thus generated to the FIFO.

The value of the second current clock frequency value is a measured value of the second clock signal (clk2) for the current time interval, and the value of the current predicted clock frequency (f(i)) represents a predicted value of the frequency of the first clock signal (clk1) for the current time interval.

For effecting sampling rate conversion, such a sampling rate conversion apparatus for converting first data, sampled at a first sampling rate, into second data, sampled at a second sampling rate, may be used, which comprises a FIFO (3) for storing the first data responsive to a first clock signal (clk1) and for outputting the first data as second data responsive to the second clock signal (clk2), with the FIFO storing the first data written directly previously based on a write control signal indicating whether or not the first data written directly previously is to be updated to the first data, and with the FIFO outputting the second data read out based on a read control signal (hold flag) indicating whether or not the second data as read out is to be read out during the next time interval as well, a frequency detection unit (2) for being supplied with the first data to output the data to the FIFO (3), and for measuring the first clock signal (clk1) during the current period for generating the value of a first current clock frequency (g(i)), the frequency detection unit also generating the value of a current predicted clock frequency (f(i)) from the value of the first current clock frequency (g(i)) and from the value of a directly previously predicted clock frequency (f(i−1)), with the frequency detection unit employing the value of the current predicted clock frequency (f(i)) as the value of the directly previously predicted clock frequency (f(i−1)) for the next time interval, and a calculating unit (1) for generating the write control signal (disable flag) and the read control signal (hold flag) from the value of a second current clock frequency, generated by measuring the second clock signal (clk2) during the current period, and from the value of the current predicted clock frequency (f(i)), with the calculating unit outputting the write control signal and the read control signal thus generated to the FIFO (3).

In the sampling rate conversion apparatus according to the present invention, the frequency detection unit (2) measures the second clock signal (clk2), in place of the first clock signal (clk1), during the aforementioned current time interval, to generate the value of the first current clock frequency g(i). The calculating unit (1) measures the first clock signal (clk1), in place of the second clock signal (clk2), during the aforementioned current time interval, to generate the value of the second current clock frequency.

In this manner, it becomes possible to measure frequency variations in real-time based on the number of clocks measured for a certain time interval. Moreover, it becomes possible to measure the cumulative error between the predicted frequency calculated last time and the frequency actually measured this time. By calculating the value of the predicted frequency so that the cumulative error approaches to zero, sampling rate conversion employing an accurate frequency ratio becomes possible even in case the apparatus is used for prolonged time.

In the sampling rate conversion apparatus according to the present invention, the FIFO (3) includes a write pointer and a read pointer. The write pointer is incremented when the first data is stored in an area specified by the write pointer, while the read pointer is incremented when the first data is stored in an area specified by the write pointer. The read pointer is incremented when the first data is stored in an area specified by the write pointer. The read pointer is incremented when the second data is stored in an area specified by the read pointer. The write control signal (disable flag) controls the inhibition of incrementing of the write pointer, while the read control signal (hold flag) controls the inhibition of incrementing of the read pointer.

In the sampling rate conversion apparatus according to the present invention, the time interval of the current time interval, as the time interval for measuring the frequency, is set so as to be short and long for the first clock signal, anticipated to undergo severe variations, and for the first clock signal, anticipated to undergo only moderate variations, respectively.

In the present sampling rate conversion apparatus, the frequency detection unit (2) determines the current cumulative error ($\Delta(i)$), which is the cumulative error up to the current time, based on a difference between the value of the directly previously predicted clock frequency (f(i−1)) and the first current frequency value (g(i)) and on the directly previous cumulative error ($\Delta(i-1)$). The directly previous cumulative error ($\Delta(i-1)$) is updated to the current cumulative error ($\Delta(i)$) determined, which current cumulative error ($\Delta(i)$) is used during the next time interval as the directly previous cumulative error ($\Delta(i-1)$).

In the present sampling rate conversion apparatus, the frequency detection unit (2) determines the value of the current predicted clock frequency (f(i)) based on the value of the first current clock frequency (g(i)) and the current cumulative error ($\Delta(i)$) multiplied by k ($0<k\leq1$).

In the present sampling rate conversion apparatus, the value of k is a parameter for controlling the rate at which the value of the current predicted clock frequency (f(i)) approaches to the value of the first current clock frequency (g(i)). The value of k is determined based on the degree of variation of the clock frequency.

With use of such value k, the predicted frequency may be stabilized by setting the value of k to a smaller value in case e.g. the value of the actual clock frequency is fluctuating, by setting the value of k to a smaller value such as to suppress the oscillations of the predicted frequency. In case the value of the actual clock frequency is varied suddenly significantly, the value of k may be set to a larger value for enabling the predicted frequency to follow up with the variations of the measured frequency for thereby stabilizing the predicted frequency.

According to the present invention, there is provided a sampling rate conversion method for converting first data, sampled at a first sampling rate, into second data, sampled at a second sampling rate, comprising a step of storing the first data responsive to a first clock signal (clk1), a step of outputting the first data as second data responsive to the second clock signal (clk2), a step of storing the first data, written directly previously, based on a write control signal (disable flag) indicating whether or not the directly previously written first data is to be updated to the first data, a step of reading out the second data based on a read control signal (hold flag) indicating whether or not the second data as read out is to be read out for the next time interval as well, and a step of generating the write control signal (disable flag) and the read control signal (hold flag) from the value of a second current clock frequency, as a measured value of the frequency of the second clock signal (clk2) for the current time interval, and from the value of the current predicted clock frequency (f(i)) representing a predicted value of the frequency of the first clock signal (clk1).

According to the present invention, there is provided a sampling rate conversion method for converting first data, sampled at a first sampling rate, into second data, sampled at a second sampling rate, comprising a step of storing the first data responsive to a first clock signal (clk1), a step of outputting the first data as second data responsive to the second clock signal (clk2), a step of storing the first data, written directly previously, based on a write control signal (disable flag) indicating whether or not the directly previously written first data is to be updated to the first data, a step of reading out the second data based on a read control signal (hold flag) indicating whether or not the second data as read out is to be read out for the next time interval as well, a step of measuring the first clock signal (clk1) during the current time interval to generate a value of a first current clock frequency (g(i)), a step of generating the value of a current predicted clock frequency (f(i)) from the value of the current clock frequency (g(i)) and from the value of the directly previously predicted clock frequency (f(i−1)), a step of employing the value of the current predicted clock frequency (f(i)) as the value of the directly previously predicted clock frequency (f(i−1)), and a step of generating the write control signal (disable flag) and the read control signal (hold flag) from the value of a second current clock frequency, generated by measuring the second clock signal (clk2) during the current time interval, and from the value of the current predicted clock frequency.

For effecting sampling rate conversion, the sampling rate conversion method may be used, which further comprises a step of measuring the second clock signal (clk2) in place of the first clock signal (clk1) during the current time interval to generate the value of the first current clock frequency (g(i)), and a step of generating the value of the second clock frequency by measuring the first clock signal (clk1) in place of the second clock signal clk2 during the current time interval.

For effecting sampling rate conversion, the sampling rate conversion method may be used, which further comprises a step of incrementing the write pointer when the first data is stored in an area specified by a write pointer, a step of incrementing the read pointer when the second data is read out from an area specified by a read pointer, a step of controlling the inhibiting of incrementing of the write control signal (disable flag) by the write control signal, and a step of controlling the inhibiting of incrementing of the read pointer (hold flag) by the read control signal.

For effecting sampling rate conversion, the sampling rate conversion method may be used, in which the time interval of the current time interval, as a frequency measurement time interval, is shorter and longer for the first clock signal anticipated to undergo severe variations and for the first clock signal anticipated to undergo only moderate variations.

For effecting sampling rate conversion, the sampling rate conversion method may be used, which comprises a step of determining a current cumulative error ($\Delta(i)$), as the cumulative error up to the current time, based on the difference between the value of directly previously predicted clock frequency (f(i−1)) and the value of the first current clock frequency (g(i)) and on the directly previous cumulative error ($\Delta(i-1)$), and updating the directly previous cumulative error ($\Delta(i-1)$) to the so determined current cumulative error ($\Delta(i)$), and a step of using the current cumulative error during the next current time interval as the cumulative error.

For effecting sampling rate conversion, the sampling rate conversion method may be used, in which the value of the current predicted clock frequency is determined based on the value of the first current clock frequency (g(i)) and the current cumulative error ($\Delta(i)$) multiplied by k ($0<k\leq 1$).

For effecting sampling rate conversion, the sampling rate conversion method may be used, in which the value of k is a parameter for controlling the rate at which the value of the current predicted clock frequency (f(i)) approaches to the value of the first current clock frequency (g(i)), and in which the value of k is determined based on the degree of variation of the clock frequency.

In alternative expressions, such a sampling rate conversion apparatus which comprises a frequency ratio detection means (2), a calculating means (1) and a FIFO (3) may be used for effecting sampling rate conversion. The frequency detection ratio means (2) is supplied with a first clock signal (clk1) and with a second clock signal (clk2) to measure the first clock signal (clk1) during the current time interval and to calculate the current cumulative error ($\Delta(i)$) based on the first current clock frequency (g(i)), obtained by the above measurement, the directly previously predicted clock frequency (f(i−1)), as directly previously measured, and on the directly previous cumulative error ($\Delta(i-1)$). The frequency ratio detection means (2) outputs a value of the second current clock frequency, generated by measuring the value of the directly previously predicted frequency (f(i−1)) and the second clock signal (clk2) during the current time interval. The calculating means (1) carries out calculations for converting the first data, digitized at the first sampling rate, into second data of the second sampling rate. The first calculating means (1) is supplied with the directly previously predicted clock frequency (f(i−1)) and with the second current clock frequency to carry out the above calculations on the directly previously predicted clock frequency (f(i−1)) and on the second current clock frequency. The FIFO (3) outputs the first data, supplied thereto in synchronism with the first clock signal (clk1), in synchronism with the second clock signal (clk2), based on the output of the calculating means (1).

The frequency ratio detection means (2) calculates the value of the current predicted clock frequency corresponding to the first current clock frequency (g(i)) and the aforementioned current cumulative error (Δ(i)), responsive to lapse of the current time interval. The value of the current predicted clock frequency (f(i)) is used during the next time interval as the value of the directly previously predicted clock frequency (f(i−1)).

For effecting sampling rate conversion, such a sampling rate conversion apparatus is used, in which the frequency detection unit (2) is set to an optional multiplication value larger than 0 and not larger than 1. The first current clock frequency (g(i)) is summed to a product of the current cumulative error (Δ(i)) and the above multiplication value. The resultant sum is used as the aforementioned current predicted clock frequency (f(i)).

In the sampling rate conversion apparatus, the calculation means (1) detects the state of frequency variations of the first clock signal (clk1) and, based on the detected results, determines the above multiplication value.

For effecting sampling rate conversion, such a sampling rate conversion apparatus is used, which comprises a first cumulative addition unit, supplied with the value of the predicted clock frequency and with the value of the second clock frequency to hold a value corresponding to cumulative summation of the predictive clock frequency in synchronism with the first clock signal (clk1), a calculation means (1) including a second cumulative addition unit for holding a value corresponding to cumulative summation of the values of the second clock frequency in synchronism with the first clock signal (clk1) and a first comparator unit for comparing an output of the first cumulative addition unit to an output of the second cumulative addition unit to render the holding flag active when the output of the first cumulative addition unit is smaller than the output of the second cumulative addition unit, and a FIFO (3) for outputting first data, entered in synchronism with the first clock signal (clk1) in synchronism with the second clock signal (clk2) based on the second clock signal clk2 based on an output of the first comparator unit.

For effecting sampling rate conversion, the calculating means (1) of the sampling rate conversion apparatus includes a second comparator unit for comparing an output of the first cumulative addition unit to an output of the second cumulative addition unit to render a standby flag active when the output of the second cumulative addition unit is smaller than the output of the first cumulative addition unit. The FIFO (3) outputs the first data in synchronism with the second clock signal (clk2) based on the output of the first cumulative addition unit and the output of the second cumulative addition unit.

For effecting sampling rate conversion, the calculating means (1) of the sampling rate conversion apparatus includes a first register for holding a value corresponding to cumulative summation of the values of the predicted clock frequency in synchronism with the first clock signal (clk1), a second register for holding a value corresponding to cumulative summation of the values of the second clock frequency in synchronism with the first clock signal (clk1), and a first comparator for comparing an output of the first register to an output of the second register. The first comparator is responsive to detection of an output of the second register larger than the first register output to render the holding flag active. The second register is supplied with the holding flag to halt the operation of cumulative summation in agreement with the holding flag, and to hold an output value of the second register, while the FIFO (3) outputs the first data in synchronism with the second clock signal (clk2) based on an output of the first comparator.

For effecting sampling rate conversion, the calculating means (1) of the sampling rate conversion apparatus includes a first register for holding a value corresponding to cumulative sum of the values of the predicted clock frequency in synchronism with the first clock signal (clk1), a second register for holding a value corresponding to cumulative sum of the values of the second clock frequency in synchronism with the first clock signal (clk1), and a second comparator for comparing the output of the first register to an output of the second register.

The second comparator is responsive to detection of an output of the second register larger than the first register output to render the standby flag active. The first register is supplied with the standby flag to halt the operation of cumulative summation and to hold an output value of the first register, while the FIFO (3) outputs the first data in synchronism with the second clock signal (clk2) based on an output of the first comparator and an output of the second comparator.

For effecting sampling rate conversion, the FIFO (3) of the sampling rate conversion apparatus includes a memory in which to write data, corresponding to the first data added by the holding flag, in synchronism with the first clock signal (clk1), and a register for incrementing a read pointer for reading out data from the memory.

The register is supplied with the standby flag and inhibits the incrementing of the write pointer for overwriting the data responsive to the standby flag.

For effecting sampling rate conversion, the FIFO (3) of the sampling rate conversion apparatus includes a register for incrementing a read pointer for reading out data from the memory. The memory is responsive to the second clock signal (clk2) to read out the data, whilst the register is responsive to the holding flag added to the read-out data to inhibit the incrementing of the read pointer.

For effecting sampling rate conversion, such a sampling rate conversion method is used, which comprises a step of being supplied with a first clock signal (clk1) and a second clock signal (clk2), measuring the input a first clock signal (clk1) during the current time interval, and calculating a current cumulative error (Δ(i)) based on the value of a first current clock frequency (g(i)), the value of the directly previously predicted frequency (f(i−1)) and the directly previous cumulative error (Δ(i−1)), a step of measuring the second clock signal (clk2) during the current time interval to generate the value of a second current clock frequency, a step of carrying out calculations on the value of the directly previously predicted frequency (f(i−1)) and the value of the second current clock frequency for converting first data digitized with the first sampling rate into second data of the second sampling rate, a step of outputting the value of the second current clock frequency and the value of the directly previously predicted frequency (f(i−1)), a step of calculating the value of a current predicted frequency (f(i)), corresponding to the current cumulative error (Δ(i)) and the value of the first current clock frequency (g(i)), responsive to the lapse of the current time interval, and a step of employing the value of the current predicted frequency (f(i)) as a value of the directly previously predicted frequency (f(i−1)) during the next time interval.

For effecting sampling rate conversion, the above sampling rate conversion method further includes a step of adding the first current clock frequency (g(i)) to the current cumulative error (Δ(i)) multiplied by the multiplication value optionally set so as to be larger than 0 and not larger than 1 to use the result of addition as the current predicted frequency (f(i)).

For effecting sampling rate conversion, the above sampling rate conversion method further includes a step of detecting the degree of frequency variation of the first clock signal (clk1) and a step of determining the value of the multiplication value based on the result of detection.

For effecting sampling rate conversion, the above sampling rate conversion method further includes a step of holding the value of a first cumulative sum of the values of the predicted frequency, in synchronism with the first clock signal (clk1), a step of holding the value of a second cumulative sum of the values of the predicted frequency, in synchronism with the first clock signal (clk1), a step of comparing the first cumulative sum to the second cumulative sum, a step of activating the holding flag responsive to detection of the value of the second cumulative sum larger than the value of the first cumulative sum, and a step of outputting the first data, based on the holding flag, in synchronism with the second clock signal (clk2).

For effecting sampling rate conversion, the above sampling rate conversion method further includes a step of comparing the value of the first cumulative sum to the value of the second cumulative sum, a step of activating a standby flag responsive to detection of the value of the first cumulative sum larger than the value of the second cumulative sum, and a step of outputting the first data, based on the holding flag and the standby flag, in synchronism with the second clock signal (clk2).

For effecting sampling rate conversion, the above sampling rate conversion method further includes a step of holding the value of cumulative summation of the values of the predicted frequency, in synchronism with the first clock signal (clk1), in a first register, a step of holding the value of cumulative summation of the values of the second frequency, in synchronism with the first clock signal (clk1), in a second register, a step of comparing an output of the first register to an output of the second register, a step of activating the holding flag responsive to detection of an output of the second register larger than an output of the first register, a step of halting the operation of cumulative summation and holding an output value of the second register responsive to inputting of the holding flag to the second register, and a step of outputting the first data, based on an output of the first comparator, in synchronism with the second clock signal (clk2).

For effecting sampling rate conversion, the above sampling rate conversion method further includes a step of comparing the output of the first register to the output of the second register, a step of activating the standby flag responsive to detection of an output of the first register larger than the output of the second register;

a step of halting the operation of cumulative summation to hold the output value of the first register responsive to inputting of the standby flag to the first register, and a step of outputting the first data, based on the output of the first comparator and on the output of the second comparator in synchronism with the second clock signal (clk2).

For effecting sampling rate conversion, the above sampling rate conversion method further includes a step of writing data corresponding to the first data added by the holding flag in a memory, in synchronism with the first clock signal (clk1), a step of incrementing a write pointer for writing data in the memory, and a step of halting the incrementing of the write pointer in the memory responsive to inputting of the standby flag.

For effecting sampling rate conversion, the above sampling rate conversion method may further include a step of incrementing a read pointer for reading out data from the memory, a step of incrementing a read pointer for reading out data from the memory, a step of reading out data in synchronism with the second clock signal (clk2), and a step of halting the incrementing of the read pointer responsive to the holding flag added to the read-out data.

The meritorious effects of the present invention are summarized as follows.

The present invention gives such a meritorious effect that a sampling rate conversion method and a sampling rate conversion apparatus may be provided in which it is possible to generate an output signal converted to high accuracy between two sampling rates that are based on two clock signals different in both the frequency and the source of generation.

The present invention also gives such a meritorious effect that a sampling rate conversion apparatus may be provided which is formed by a simplified circuit and which operates to extremely high accuracy.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
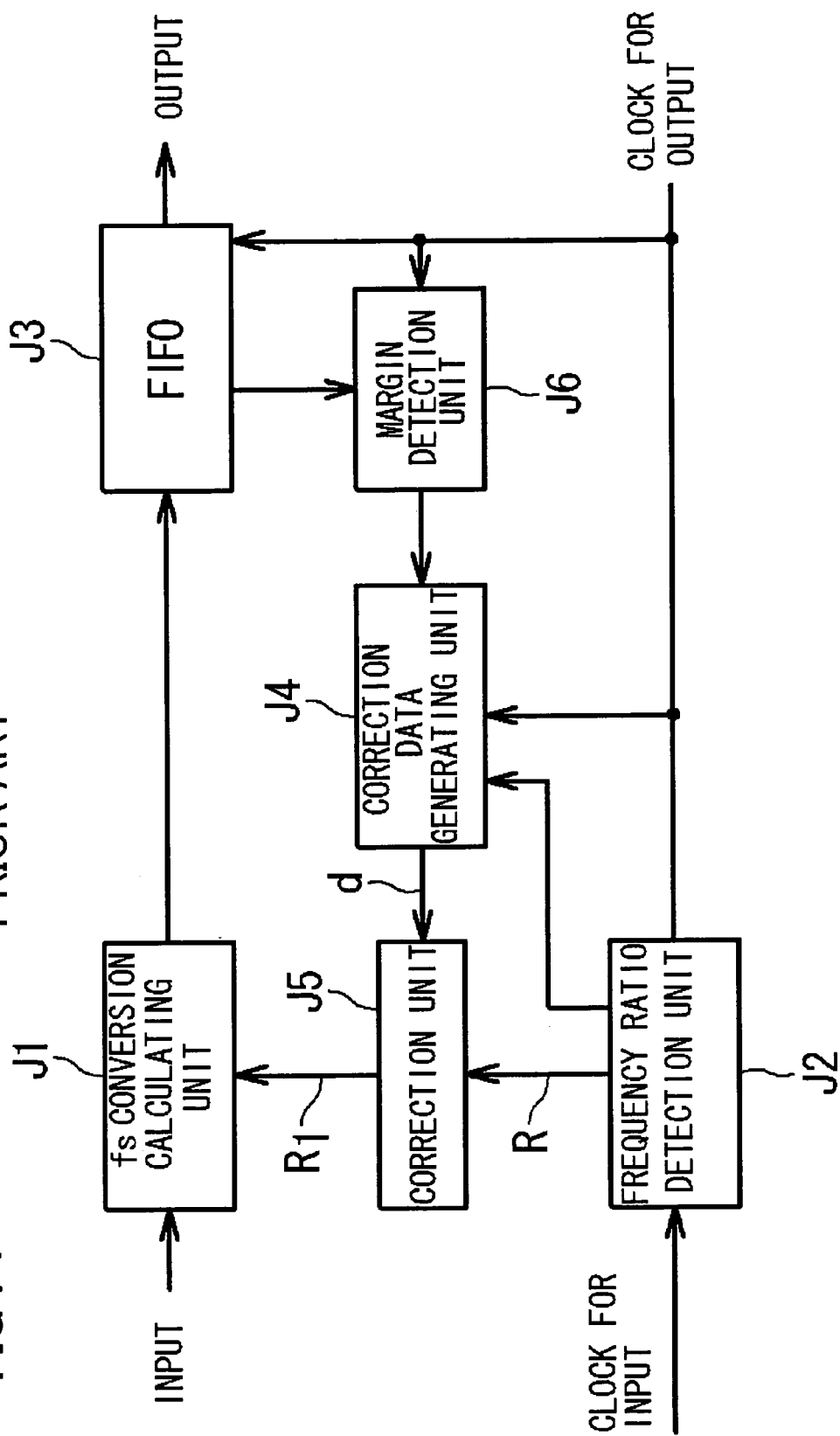
FIG. 1 is a block diagram showing a conventional sampling rate conversion apparatus.

Referring to the drawings, the best mode for carrying out the present invention is explained.

Figure 2:
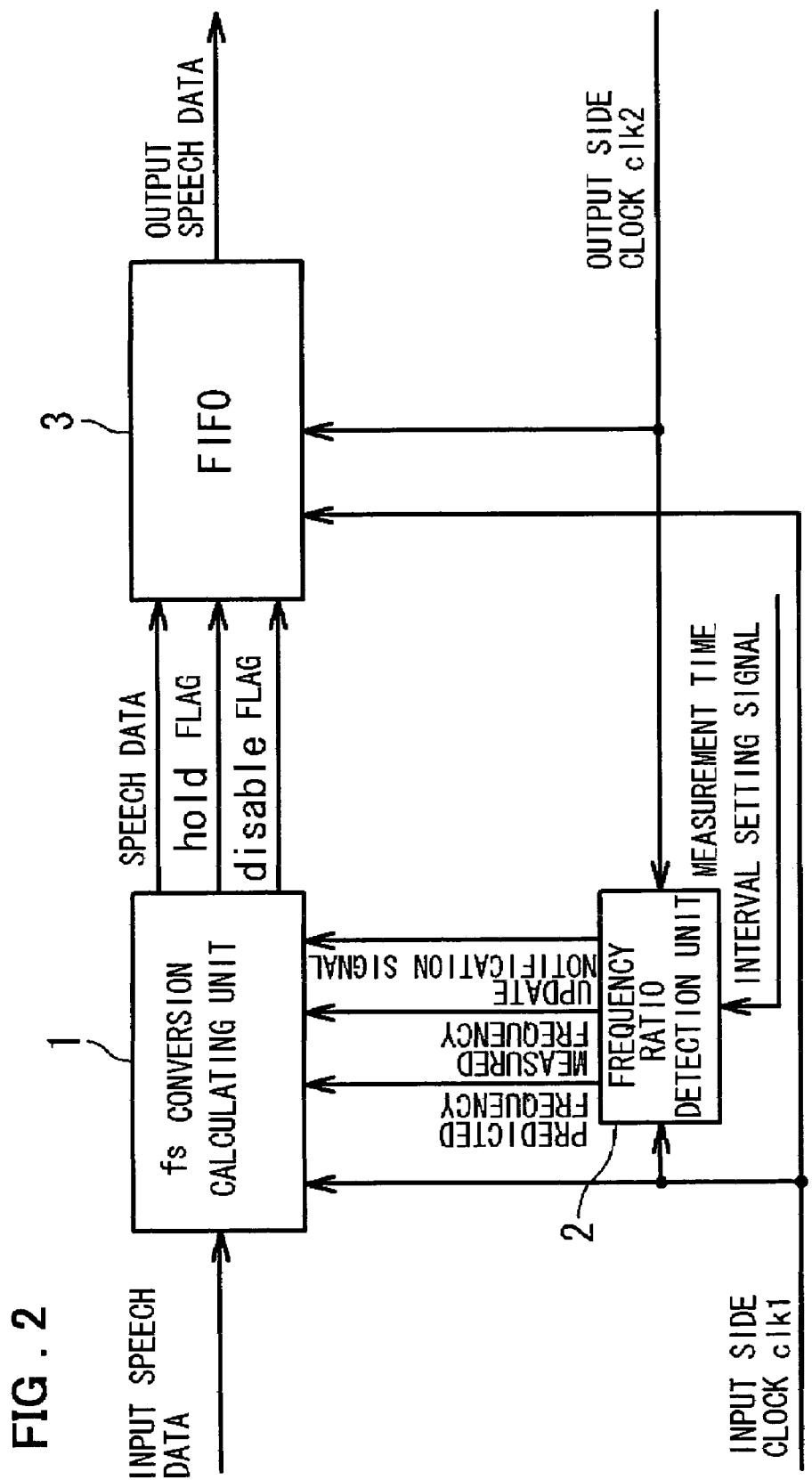
FIG. 2 is a block diagram showing sampling rate conversion apparatus according to the present invention.

FIG. 2 is a block diagram showing the configuration of a sampling rate conversion apparatus in the best mode for carrying out the present invention. In the following explanation, a case of calculating the prediction frequency of an input side clock signal clk1 is taken as an example. However, in case the prediction frequency of an output side clock signal clk2 is calculated to effect sampling rate conversion, the sampling rate conversion of the present invention can be achieved by a similar sequence of operations. Referring to FIG. 2, the sampling rate conversion apparatus of the present embodiment is formed by an fs conversion calculating unit 1, a frequency detection unit 2 and by a FIFO 3.

The fs conversion calculating unit 1 is a calculating functional block for effecting calculation processing necessary for sampling rate conversion based on a prediction frequency, a measured frequency and an update notification signal, output from the frequency detection unit 2.

The frequency detection unit 2 is a frequency ratio detection functional block for calculating a frequency value necessary for sampling rate conversion based on an input side clock signal clk1, an output side clock signal clk2 and on a measurement period setting signal. The frequency detection unit 2 foresees that the frequency of the input side clock signal clk1 is varied dynamically and finds the predicted frequency taking the frequency variations into account. The measured frequency is the number of the output side clock signal clk2, input to the frequency detection unit 2, and counted by a counter, not shown, provided to the frequency detection unit 2, during the time as set by the measurement period setting signal.

The FIFO 3 outputs speech data, output from the fs conversion calculating unit 1, based on a hold flag and a disable flag, output from the fs conversion calculating unit 1, in synchronism with the output side clock signal clk2, as new speech data, by way of converting the sampling rate.

Figure 3:
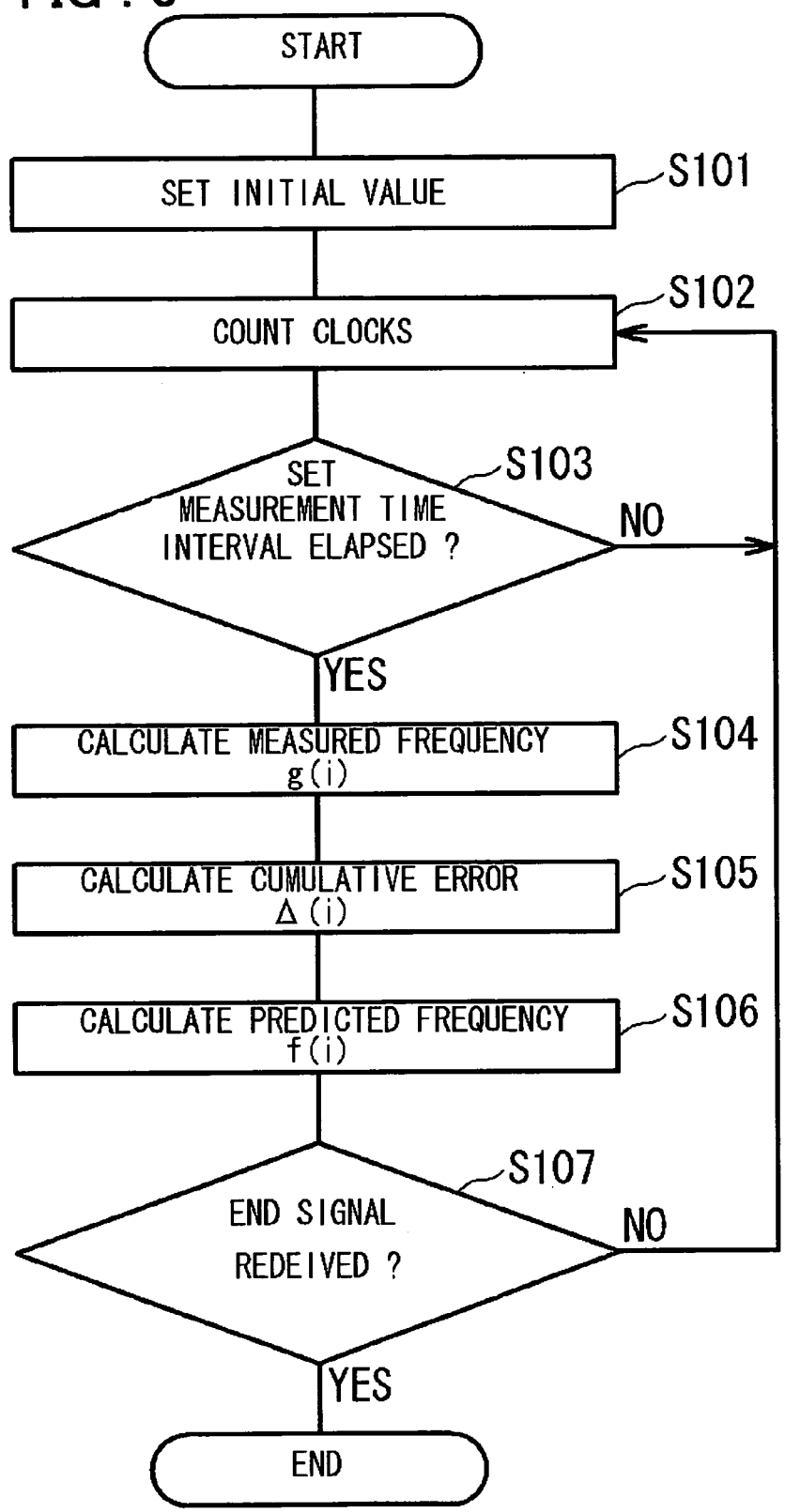
FIG. 3 is a flowchart for illustrating the operation of the sampling rate conversion method and apparatus according to the present invention.

FIG. 3 is a flowchart for illustrating the operation of the frequency detection unit 2 calculating the predicted frequency. The measured frequency g(i), shown in FIG. 3, indicates the frequency obtained by the counter provided to the frequency detection unit 2 actually counting the input side clock signal clk1, and i indicates the number of times of error correction incremented at an constant interval.

The measured frequency f(i) indicates the frequency predicted by the frequency detection unit 2, and assumes a value represented by $$f(i)=\{g(i)+k\Delta(i)\} \quad (1).$$

The cumulative error $\Delta(i)$ indicates a cumulative error calculated from the predicted frequency f(i−1), measured frequency g(i) and from the cumulative error $\Delta(i-1)$, and assumes a value represented by $$\Delta(i)=g(i)-\{f(i-1)-\Delta(i-1)\} \quad (2)$$

$$(\text{or } \Delta(i+1)=g(i+1)-\{f(i)-\Delta(i)\}) \quad (2)'.$$

In the above equations, k is a parameter for controlling the rate of convergence and assumes an optional value such that $0<k\leq 1$. By setting the value of k in keeping with temperature drift or jitter characteristics, the rate of convergence of the predicted frequency f(i) can be varied in agreement with an apparatus in question. For example, if the measured frequency g(i) of the actual input side clock signal clk1 is changed in an oscillating fashion, the predicted frequency also undergoes oscillation. In such case, the value of k may be set to a smaller value to suppress oscillation of the predicted frequency f(i). If, in case the measured frequency g(i) of the input side clock signal clk1 is changed suddenly appreciably, change in the predicted frequency f(i) is moderate, such that the predicted frequency cannot follow up with variation in the measured frequency. In such case, the value of k may be set to a larger value, whereby the predicted frequency f(i) can follow up with the variation in the measured frequency.

Referring to FIG. 3, the operation of the frequency detection unit 2 commences with start of the operation of the sampling rate conversion apparatus of the present embodiment (e.g. on power up or resetting of the sampling rate conversion apparatus).

In a step S101, the frequency detection unit 2 reads-in a preset initial value, stored in a register, not shown. In a step S102, the number of clocks is measured, with the output side clock signal clk2 as reference. To this end, a counter, not shown, is provided for counting the rising edges of the input side clock signal clk1, and a count value of the counter is taken, every preset time interval, using a timer operated with the output side clock signal clk2.

In a step S103, the frequency detection unit 2 monitors whether or not the measurement time interval, as set with the measurement time setting signal, has elapsed. If the measurement time interval has elapsed, the frequency detection unit proceeds to a step S104 and, if otherwise, it continues counting the number of clocks. As regards the setting of the measurement time interval, the measurement time interval is set so as to be short in case an error between the actual frequency and the predicted frequency of the input side clock signal clk1 is predicted to be large or in case the variations in the measured frequency are severe. The measurement time interval is set so as to be longer in case an error between the actual frequency and the predicted frequency of the input side clock signal clk1 is predicted to be small. By so setting the measurement time interval, stabilized operations may be achieved. In case of the usual operation, it is desirable to set the measurement time so as to be longer and to re-set the measurement time in keeping with the cumulative error calculated.

In a step S104, the frequency detection unit 2 measures the actual frequency g(i) from the number of clocks as counted for a preset time duration. In a step S105, the frequency detection unit is responsive to completion of measurement of the actual frequency g(i) to calculate the cumulative error $\Delta(i)$. In a step S106, the frequency detection unit 2 calculates the predicted frequency f(i) from the actual frequency g(i) as measured and the cumulative error $\Delta(i)$. The frequency detection unit 2, which has completed the calculation of the actual frequency g(i), cumulative error $\Delta(i)$ and the predicted frequency f(i), proceeds to check, in a step S107, whether the signal for terminating the operation of the sampling rate conversion apparatus has been entered. If, as a result of the check, the signal for termination has been received, the processing comes to a close. If such signal has not been received, processing reverts to the step S102 to continue the processing of the steps S102 to S107. By the sequence of operations, described above, the predicted frequency f(i) is updated in terms of a time interval, as set by the measurement time interval setting signal, as a unit.

Figure 4:
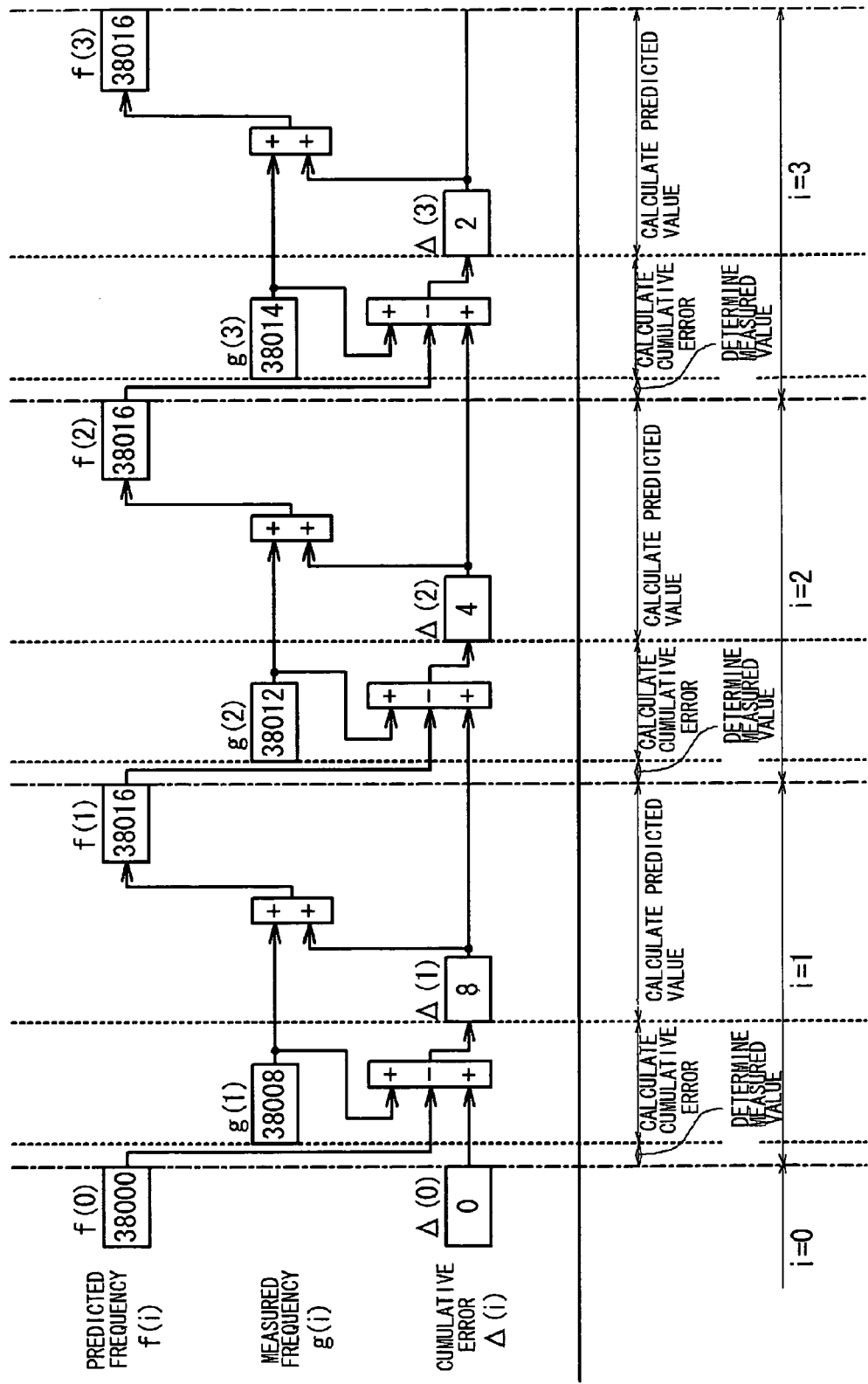
FIG. 4 shows the transition of a prediction frequency f(i), a measured frequency g(i) of an input side clock signal clk1 and a cumulative error Δ(i) with lapse of time.

The operation of the present embodiment is now explained for the case of specified frequencies. FIG. 4 shows how the predicted frequency f(i), measured actual frequency g(i) of the input side clock signal clk1 and the cumulative error $\Delta(i)$ are changed with lapse of time. Although FIG. 4 shows a case where the sampling rate of input speech data is in the vicinity of 38000 Hz and the measurement time interval as set by the time interval setting signal is one second, this is not to be construed as limiting the measurement time interval or the sampling rate of the input speech data of the present invention. FIG. 4 also shows the case where k=1.

In the case of FIG. 4, the initial setting of the predicted frequency f(0) and that of the cumulative error $\Delta(0)$ for i=0 are such that $$f(i)=f(0)=38000 \text{ and}$$

$$\Delta(i)=\Delta(0)=0.$$

The frequency detection unit 2 is responsive to lapse of the measurement time to measure the actual frequency g(i). Since the measurement time interval is one second, the actual frequency g(1) measured for i=1 is 38000 in case of extremely high precision of the oscillator. Referring to FIG. 4, the actual frequency g(1) for i=1 as measured by the frequency detection unit 2 is $$g(i)=38008.$$

The frequency detection unit 2 calculates the cumulative error $\Delta(1)$ from the initial setting value of the predicted frequency f(0), initial setting value of the cumulative error $\Delta(0)$ and the measured actual frequency g(1). From the equation (2), the frequency detection unit 2 calculates:

$$\Delta(1)=g(1)-\{f(0)-\Delta(0)\}=38008-(38000-0)=8.$$

The frequency detection unit 2 stores this value as a new cumulative error $\Delta(1)$. The frequency detection unit 2 further calculates the predicted frequency f(1), using the cumulative error $\Delta(1)$ and the measured actual frequency g(1). Since k=1, the frequency detection unit 2 calculates $$f(1)=\{g(1)+\Delta(1)\}=38008+8=38016$$

from the equation (1). The frequency detection unit 2 stores this value "38016" as the new frequency f(1).

When time elapses further, such that i=2, the frequency detection unit 2 measures the actual frequency g(2) at i=2. Referring to FIG. 4, the actual frequency g(i) at i=2 is g(2)=38012. From the predicted frequency f(1), stored at i=1, and from the cumulative error $\Delta(1)$, the frequency detection unit 2 calculates the cumulative error $\Delta(2)$ for i=2. From the equation (2), the frequency detection unit 2 calculates $$\Delta(2)=g(2)-\{f(1)-\Delta(1)\}=38012-(38016-8)=4.$$

As in the case of i=1, the frequency detection unit 2 stores this value as a new cumulative error $\Delta(2)$. The frequency detection unit 2 also calculates the predicted frequency f(2), using the cumulative error $\Delta(2)$ and the measured actual frequency g(2). Since again k=1, $$f(2)=\{g(2)+\Delta(2)\}=38012+4=38016.$$

from the equation (1). The similar sequence of operations is carried out until receipt of an end signal (for example, power down signal) is received. The frequency detection unit 2 repeats the operations of the flowchart shown in FIG. 3, as it increments the value of i, to calculate the predicted frequency f(i) at stated intervals.

In calculating a new cumulative error $\Delta(i+1)$, from the currently measured actual frequency g(i+1), a new cumulative error $\Delta(i+1)$ is calculated from the actual frequency g(i+1), currently measured, the predicted frequency f(i), predicted in the directly previous period, and from the cumulative error $\Delta(i)$, calculated in the directly previous period. In case the predicted frequency f(i), predicted in the directly previous period, is closer to the actual frequency g(i+1) than the predicted frequency f(i−1), predicted during the period previous to the directly previous period, the new cumulative error $\Delta(i+1)$ is smaller in absolute value than the directly previous cumulative error $\Delta(i)$. Since a new predicted frequency f(i+1) is calculated from the new cumulative error $\Delta(i+1)$, the predicted frequency may be calculated as the value of i is incremented, thereby enabling the predicted frequency to be measured to a higher accuracy in case the measured frequency undergoes only moderate variations.

Figure 5:
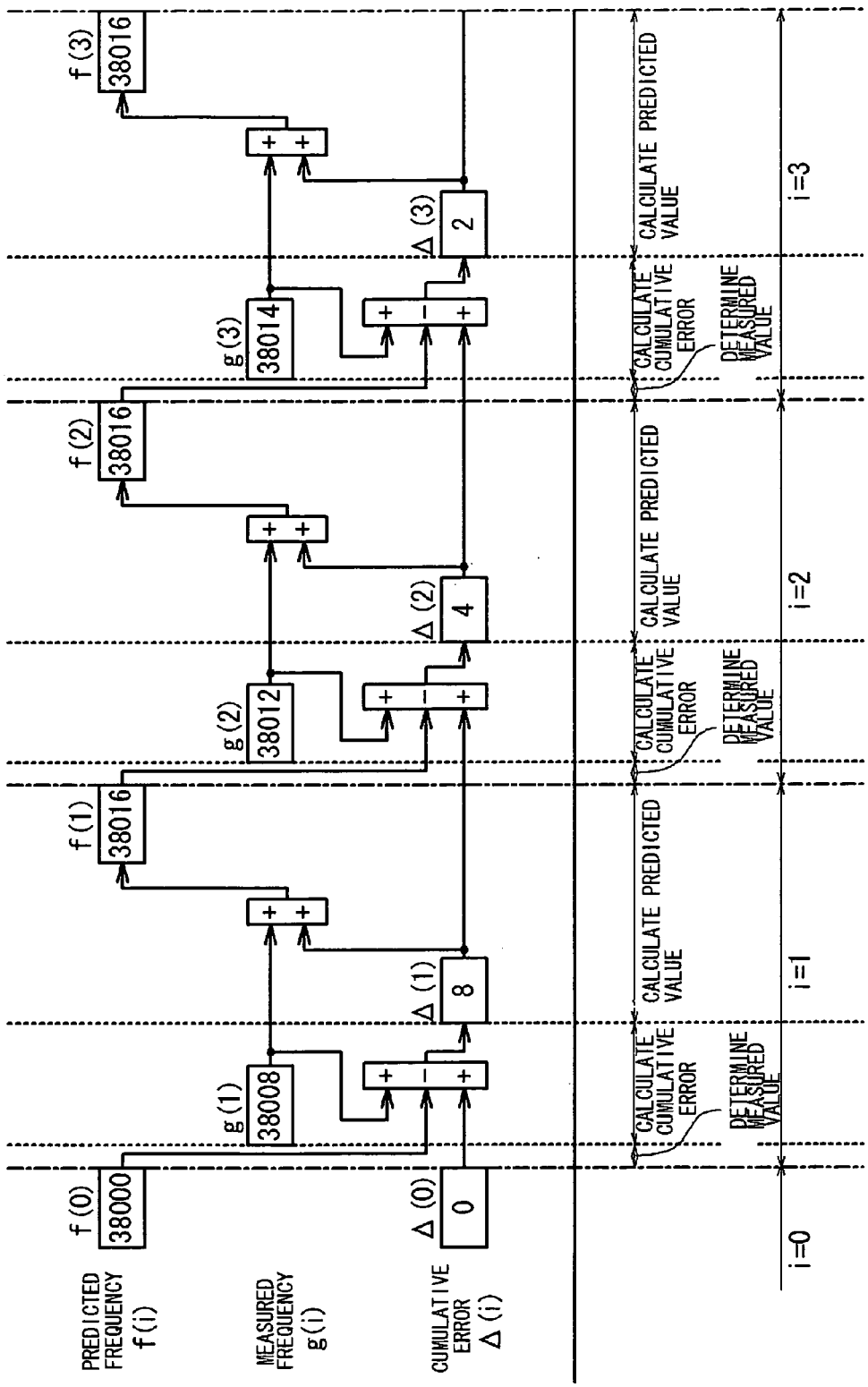
FIG. 5 shows the transition of a prediction frequency f(i), a measured frequency g(i) of an input side clock signal clk1 and a cumulative error Δ(i) with lapse of time.

Similarly to FIG. 4, FIG. 5 shows how the predicted frequency f(i), measured actual frequency g(i) of the input side clock signal clk1 and the cumulative error $\Delta(i)$ are changed with lapse of time. Although FIG. 5 shows a case where the sampling rate of input speech data is in the vicinity of 38000 Hz and the measurement time interval is one second, this is not to be construed as limiting the measurement time interval or the sampling rate of the input speech data of the present invention. FIG. 4 also shows the case where k=0.5.

In the case of FIG. 5, the initial setting of the predicted frequency f(0) and that of the cumulative error $\Delta(0)$ for i=0 are such that $$f(i)=f(0)=38000 \text{ and}$$

$$\Delta(i)=\Delta(0)=0.$$

The frequency detection unit 2 is responsive to lapse of the measurement time to measure the actual frequency g(i). Since the measurement time interval is one second, the actual frequency g(1) measured for i=1 is 38000 in case of extremely high precision of the oscillator. Referring to FIG. 5, the actual frequency g(1) for i=1 as measured by the frequency detection unit 2 is $$g(i)=38008.$$

The frequency detection unit 2 calculates the cumulative error $\Delta(1)$ from the initial setting value of the predicted frequency f(0), initial setting value of the cumulative error $\Delta(0)$ and the measured actual frequency g(1). From the equation (2), the frequency detection unit 2 calculates:

$$\Delta(1)=g(1)-\{f(0)-\Delta(0)\}=38008-(38000-0)=8.$$

The frequency detection unit 2 stores this value as a new cumulative error $\Delta(1)$.

The frequency detection unit 2 further calculates the predicted frequency f(1), using the cumulative error $\Delta(1)$ and the measured actual frequency g(1). Since k=0.5, the frequency detection unit 2 calculates $$f(1)=\{g(1)+0.5\cdot\Delta(1)\}=38008+4=38012$$

from the equation (1). The frequency detection unit 2 stores this value "38012" as the new frequency f(1).

When time elapses further, such that i=2, the frequency detection unit 2 measures the actual frequency g(2) at i=2. Referring to FIG. 5, the actual frequency g(i) at i=2, actually measured by the frequency detection unit 2, is g(2)=38012. From the predicted frequency f(1), stored at i=1, and from the cumulative error Δ(1), the frequency detection unit 2 calculates the cumulative error Δ(2) for i=2. From the equation (2), the frequency detection unit 2 calculates Δ(2)=g(2)−{f(1)−Δ(1)}=38012−(38012−8)=8.

As in the case of i=1, the frequency detection unit 2 stores this value as a new cumulative error Δ(2). The frequency detection unit 2 also calculates the predicted frequency f(2), using the cumulative error Δ(2) and the measured actual frequency g(2). Since again k=0.5, f(2)={g(2)+0.5·Δ(2)}=38012+4=38016.

from the equation (1). The similar sequence of operations is carried out until receipt of an end signal (for example, power down signal). The frequency detection unit 2 repeats the operations of the flowchart shown in FIG. 3, as it increments the value of i, to calculate the predicted frequency f(i) at stated intervals.

In calculating a new cumulative error Δ(i+1), from the currently measured actual frequency g(i+1), a new cumulative error Δ(i+1) is calculated from the actual frequency g(i+1), currently measured, the predicted frequency f(i), predicted in the directly previous period, and the cumulative error Δ(i), calculated in the directly previous period. In case the predicted frequency f(i), predicted in the directly previous period, is closer to the actual frequency g(i+1) than the predicted frequency f(i−1), predicted during the time interval previous to the directly previous period, the new cumulative error Δ(i+1) is smaller in absolute value than the directly previous cumulative error Δ(i). Since a new predicted frequency is calculated from the new cumulative error Δ(i+1), the predicted frequency may be calculated as the value of i is incremented, thereby enabling the predicted frequency to be measured to a higher accuracy in case the measured frequency undergoes moderate variations.

Thus, by taking not only the measured actual frequency g(i) but also the cumulative error Δ(i), in finding the predicted frequency f(i), the sampling rate may be converted without producing buffer overflow or data dropout, due to error, even if the sampling rate conversion apparatus is operated for prolonged time. That is, since the frequency detection unit 2 operates so that the cumulative error Δ(i) approaches to 0, there is no risk of buffer overflow due to the effect of errors. The result is that there is no necessity of monitoring the FIFO 3 for allowance and hence the apparatus may be reduced in size.

Figure 6:
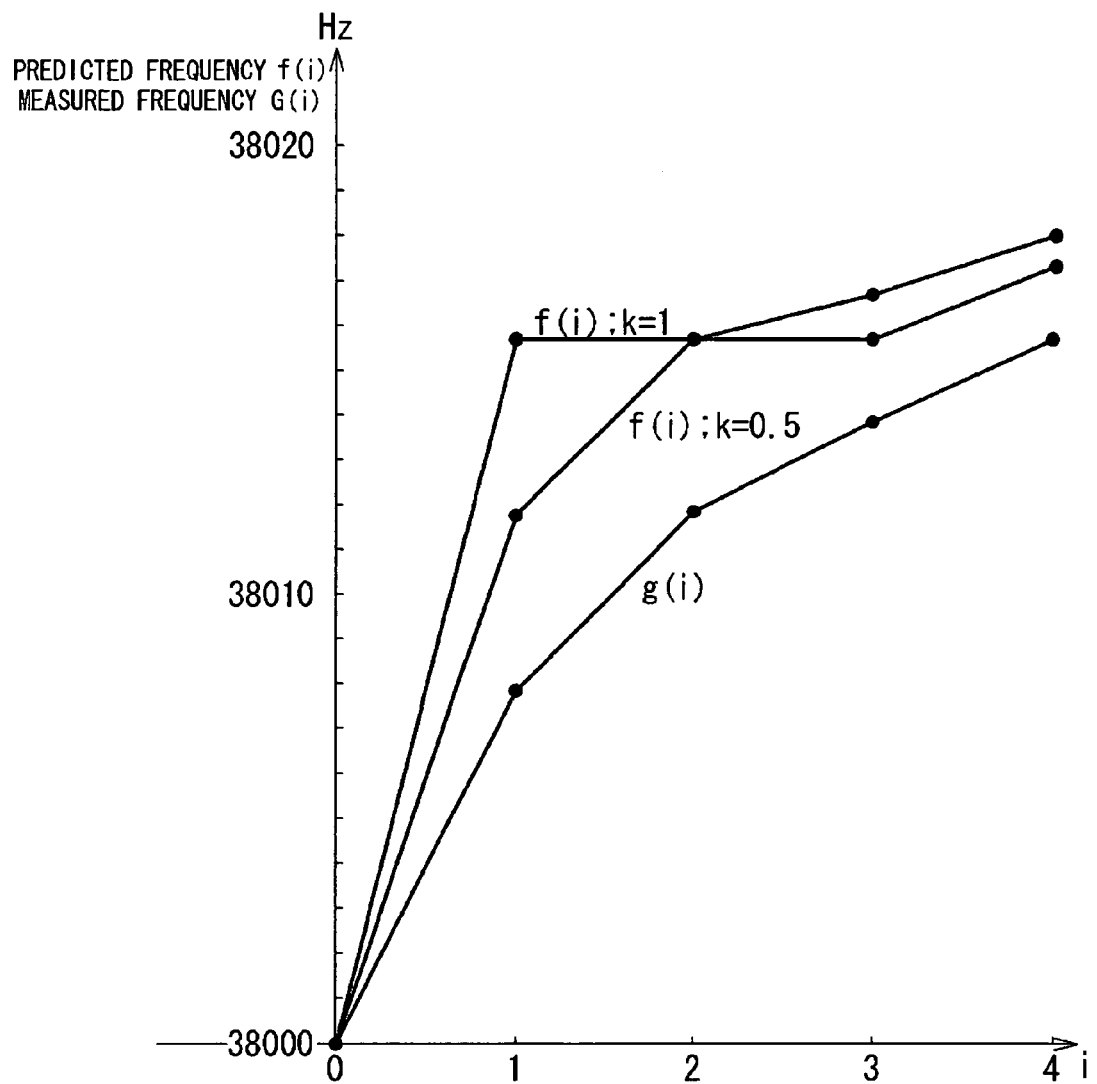
FIG. 6 is a graph for illustrating the transition of the prediction frequency f(i) and the measured frequency g(i) of the input side clock signal clk1 with lapse of time.

FIG. 6 is a graph showing how the actual measured frequency g(i) of the input side clock signal clk1 is changed with lapse of time. FIG. 6 shows the predicted frequency f(i) for k=1 and the predicted frequency f(i) for k=0.5 in case the actual measured frequency g(1)=38008, actual measured frequency g(2)=38012, actual measured frequency g(3)=38014 and the actual measured frequency g(4)=38016, for =1, 2, 3 and 4 in the actual measured frequencies g(i), respectively. As mentioned previously, k is a parameter for controlling the rate of convergence, such that, by setting k to an optional value such that 0<k≦1, it is possible to control the rate with which the predicted frequency f(i) approaches to the actual measured frequency g(i). Referring to FIG. 6, the rate of convergence is slower the closer the value of k to 0. However, in this case, the variations in the predicted frequency f(i) until the time of convergence are small. Conversely, the closer the value of k to 1, the faster is the rate of convergence, however, the predicted frequency f(i) undergoes larger variations until the time of convergence. Consequently, by setting the value of k depending on the temperature drift or jitter characteristics, the rate of convergence of the predicted frequency f(i) may be changed in keeping with the particular apparatus.

Figure 7:
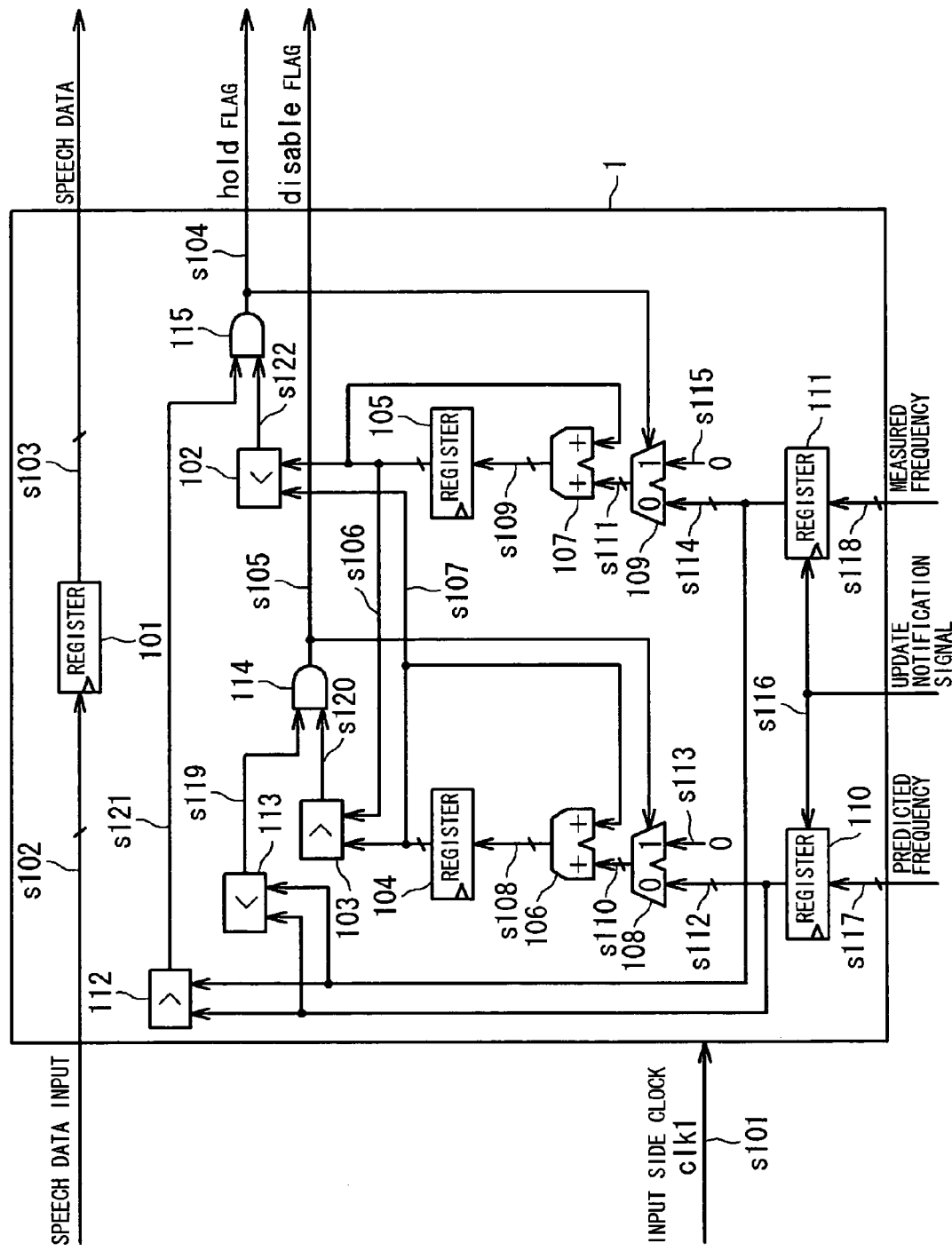
FIG. 7 is a diagram showing a typical circuit configuration of an fs conversion calculating circuit.

FIG. 7 shows an example of a specified circuit configuration of the fs conversion calculating unit 1. Referring to FIG. 7, the fs conversion calculating unit 1 is made up by a register 101, comparators 102, 103, 112, 113, registers 104, 105, adders 106, 107, selectors 108, 109, registers 110, 111 and AND gates 114, 115.

The register 101 is used for transient storage of input speech data. The register holds input speech data s102 transiently to output the data as speech data s103 to the FIFO 3. The comparators 102, 112 and the AND gate 115 make up a first comparator functional block for comparing the magnitudes of two input signal. The first comparator functional block compares a cumulative sum value of the predicted frequency and a cumulative sum value of the frequency of the output side clock signal clk2 and, in case the cumulative sum value of the frequency of the output side clock signal clk2 is larger than the cumulative sum value of the predicted frequency, sets the hold flag active. A second comparison functional block for comparing the relative magnitudes of two input signals, similar to the first comparison functional block, is made up by the comparators 103, 113 and the AND gate 114. The second comparison functional block compares a cumulative sum value of the predicted frequency to a cumulative sum value of the frequency of the output side clock signal clk2 to activate a disable flag in case the cumulative sum value of the frequency of the output side clock signal clk2 is smaller than that of the predicted frequency.

The register 104 is used for cumulative addition of the predicted frequency. The register is supplied with an output signal s108 from the adder 106 to hold the input value. The adder 106 sums the values of two input signals. Specifically, the adder 106 sums an output s107 of the register 104 to an output s110 of the selector 108 to output the signal s108. The selector 108 is a two-input one-output selector. When a select signal s105, output from the AND gate 114, is 1, a value s113 is output and, when the select signal s105 is 1, a value s112 is output. The output signal s110 is entered to the adder 106.

The register 105 cumulatively sums the actual measured frequency of the output side clock signal clk2. The register 105 is supplied with a signal s109, output from the adder 107, to hold the so entered value. Similarly to the adder 106, the adder 107 sums the values of two input signals. Specifically, the adder 107 sums an output s106 of the register 105 and an output s111 of the selector 109 to output a signal s109. Similarly to the selector 108, the selector 109 is a two-input one-output selector. When a select signal s104, output from the AND gate 115, is 1 or 0, a value of s115 or a value s114 is output, respectively. The output signal s111 is entered to the adder 107.

A register 110 stores the predicted frequency. When an update notification signal s116 is 1, the register takes in the value of a signal s117 indicating the predicted frequency. A register 111 stores the measured actual frequency of the output side clock signal clk2. When an update notification signal s116 is 1, the register takes in the value of a signal s118 indicating the measured actual frequency of the output side clock signal clk2.

Figure 8:
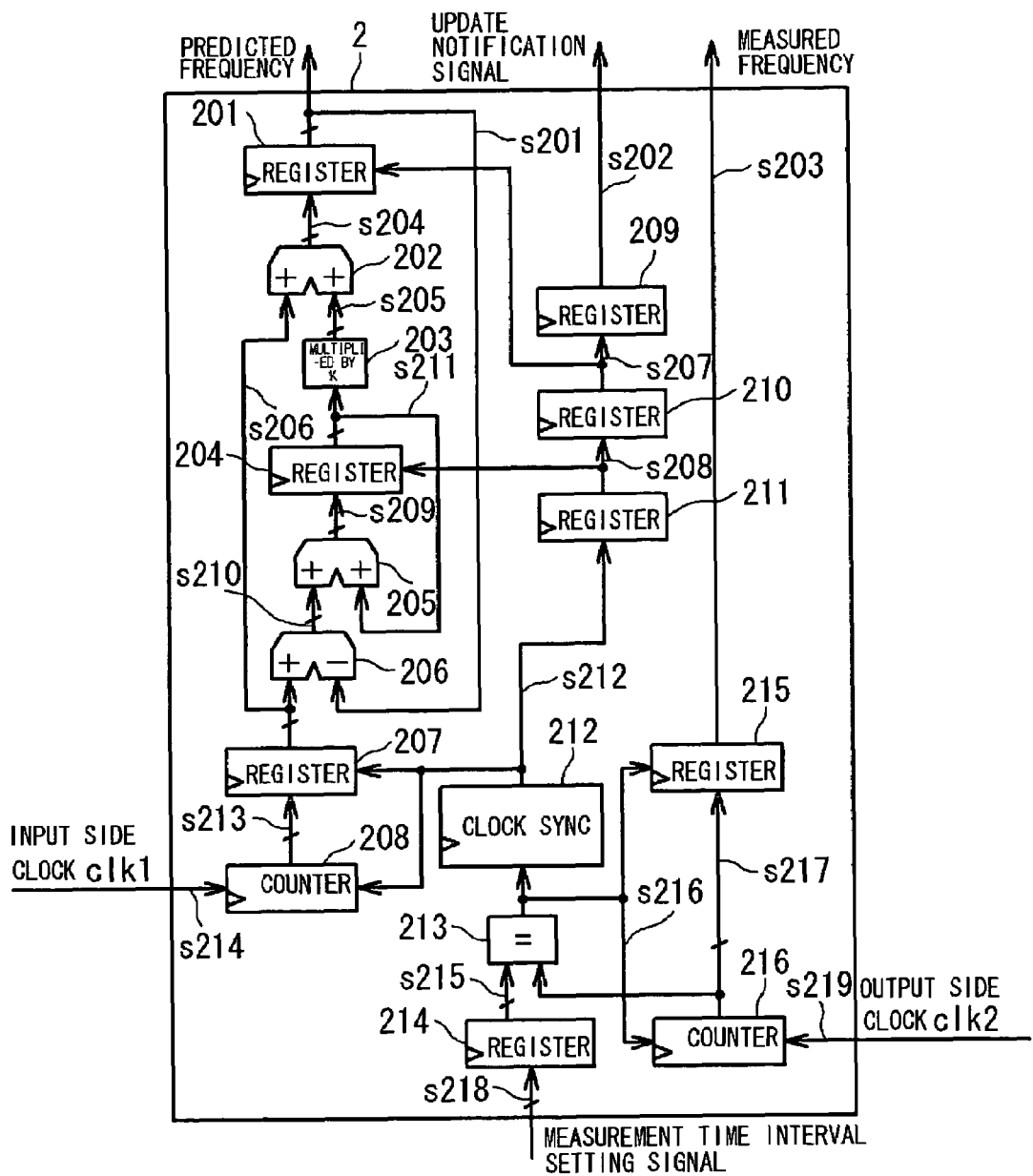
FIG. 8 is a diagram showing a typical circuit configuration of a frequency detection unit.

FIG. 8 shows an example of a specified circuit configuration of the frequency detection unit 2. Referring to FIG. 8, the frequency detection unit 2 is made up by registers 201, 204, 207, 209, 210, 211, 214, 215, adders 202, 205, 206, a multiplication circuit 203, counters 208, 216, a clock synchronization circuit 212 and a comparator circuit 213.

The register 201 holds the prediction frequency. When a signal s207, output from the register 210, is active, the register takes in the value of a signal s204, output from the adder 202. The adder 202 sums the values of two input signal to each other. Specifically, the adder 202 sums an output s205 from the multiplication circuit 203 to an output s206 from the register 207. The multiplication circuit 203 outputs the signal s205 corresponding to an output signal s211 from the register 204 multiplied by k, where k may optionally be changed within a range of $0<k\leq 1$. The value of k may be automatically changed to a value suited to the degree of frequency variations of the clock signal. With use of such value k, the frequency detection unit 2 may set the value of k to a value close to 1, in case input clock signal undergo severe frequency variations, thereby quickening the rate of convergence of the predicted frequency to cope with the severe frequency variations.

The register 204 holds the value of a cumulative error. When a signal s208, output from the register 211, is active, the register 204 takes in the value of a signal s209, output from the adder 205. The adder 205 sums the values of two input signal. Specifically, the adder 205 sums an output s211 of the register 204 to an output s210 from the adder 206. The adder 206 sums the values of two input signal. Specifically, the adder 206 takes a 2's complement of an output s201 from the register 201 to sum the result to an output s206 from the register 207.

The register 207 holds the value of the actual measured frequency of the input side clock signal clk1. When a signal s212, output from the clock synchronization circuit 212, is active, the register 207 takes in a value of the signal s213, output from the counter 208. The counter 208 has its count value incremented by one in timed relation to a rising edge of a signal s214 which is the input side clock signal clk1. The count value of the counter 208 is reset to 1 when a signal s212 from the clock synchronization circuit 212 is active.

The register 209 outputs an update notification signal s202. The register 210 generates an update timing signal s207 of the register 201. The register 211 generates the update timing signal s208 of the register 204.

The clock synchronization circuit 212 is now explained. When a signal s216, synchronized with s219, which is an output side clock signal clk2, is entered, the clock synchronization circuit performs clock interchange operation to output a signal s212 synchronized with an input side clock signal. The comparator circuit 213 compares the values of two input signal to verify whether the two values are the same. If, as a result of signal comparison by the comparator circuit 213, the two input signal are of the same value, the value of the output signal s216 is activated. The signal s216, which is an output signal of the comparator circuit 213, is activated once every second in case e.g. the value of a signal s218, taken in by the register 214, is 44100, and the frequency of the output side clock signal clk2 is 44100 Hz.

The register 214 takes in a measurement time duration setting signal s218. The register 215 holds the frequency value of the output side clock signal clk2. When the signal s216, output from the comparator circuit 213, is active, the register 215 takes in the value of a signal s217 output from the counter 216. The register 215 outputs the value taken in to the fs conversion calculating unit 1 as a measured frequency s203. The counter 216 has its count value incremented by one in timed relation to a rising edge of a signal s219 which is the output side clock signal clk2. The count value of the counter 216 is reset to 1 when the signal s216 from the comparator circuit 213 is active.

Figure 9:
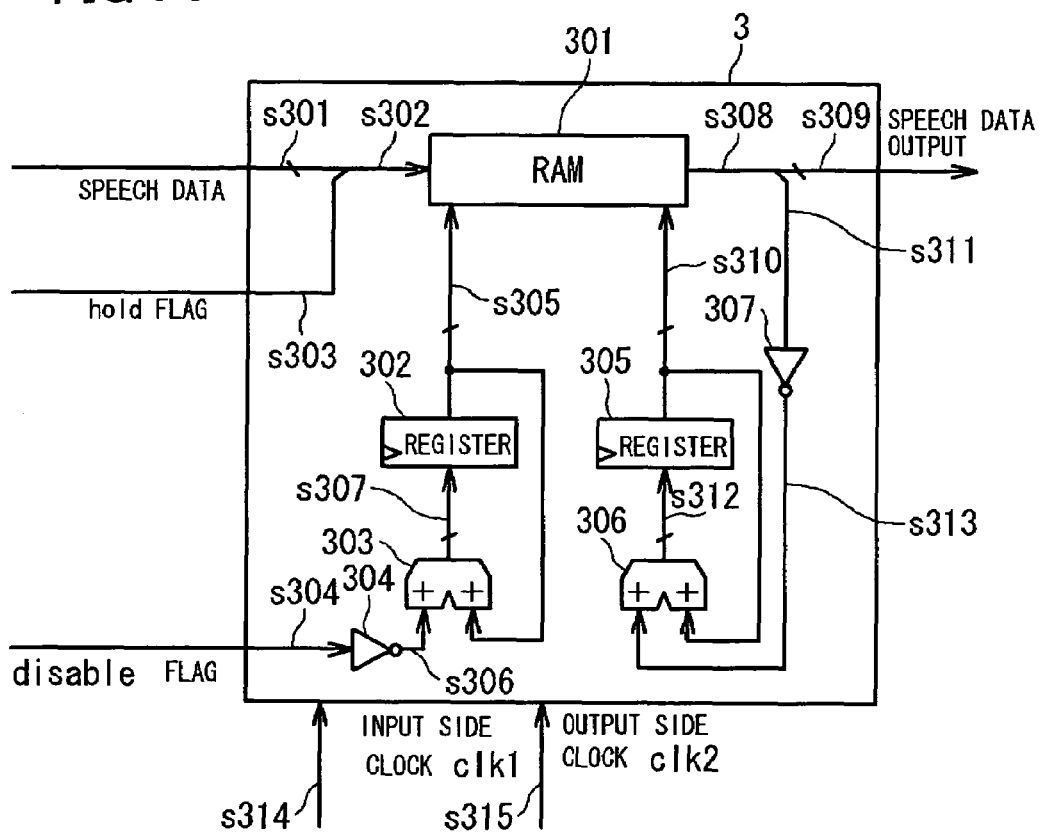
FIG. 9 is a diagram showing a typical circuit configuration of a FIFO.

FIG. 9 shows an example of a specified circuit configuration of the FIFO 3. Referring to FIG. 9, the FIFO 3 is made up by a RAM 301, a register 302, and adder 303, an inverter 304, a register 305, an adder 306 and an inverter 307.

The RAM (random access memory) 301 is used for data storage. This RAM 301 is supplied with a signal s302, obtained on adding one bit of a hold flag s303 to a MSB (most significant bit) side of speech data s301 output from the frequency detection unit 2. Consequently, the data bit width becomes larger than the speech data signal by one bit.

The register 302 is used for holding a write pointer. The register takes in the value of an output s307 of the adder 303 to output a write pointer signal s305. The adder 303 is used for summing the values of two signal. Specifically, the adder 303 sums an output signal s306 of the inverter 304 to an output s305 of the register 302.

The inverter 304 is used for inverting the signal value. The inverter is supplied with a disable flag s304, output from the frequency detection unit 2, to output the signal s304 corresponding to an inverted version of the disable flag.

The register 305 is used for holding a read pointer. The register takes in the value of an output s312 of the adder 306 to output a read pointer s310.

The adder 306 is used for summing the values of two input signal. The adder 306 sums an inverted version s313 of a signal of the MSB portion of an output signal s308 from the RAM 301, that is, a hold flag transmitted through the RAM, to the output s310 from the register 305, to output a signal s312.

The inverter 307 inverts the value of the circuit shown in FIG. 7. The inverter outputs a signal s313, which is an inverted version of the signal s311 as the hold flag transmitted through the RAM.

Figure 10:
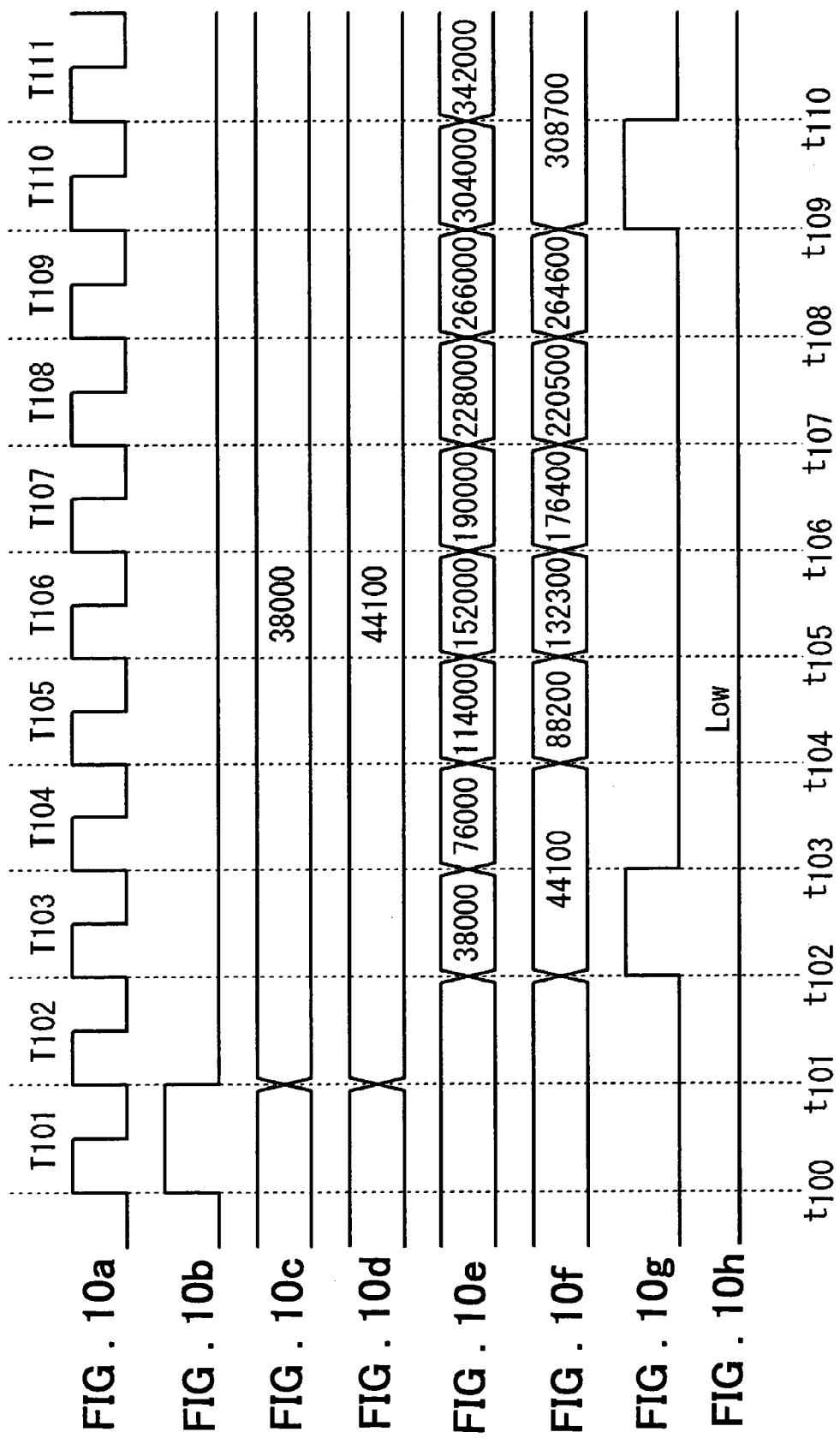
FIGS. 10a, 10b, 10c, 10d, 10e, 10f, 10g and 10h are timing charts showing the operation of the fs conversion calculating circuit.

FIG. 10 is a timing chart for illustrating the operation of the circuit shown in FIG. 7. FIG. 10a shows how s101, which is the input side clock signal clk1, is changed. FIG. 10a shows how s101, which is an input side clock signal clk1, is changed. FIG. 10b shows how the update notification signal s116 is changed. FIG. 10c shows how the predicted frequency s112, output from the register 110, is changed. FIG. 10d shows how the signal s114, output from the register 111, is changed. FIG. 10e shows how the output s107 of the register 104 is changed. FIG. 10f shows how the output s106 from the register 105 is changed. FIG. 10g shows how the hold flag s104, output from the AND gate 115, is changed. FIG. 10h shows how the disable flag s105, output from the AND gate 114, is changed.

Each of t100 to t110 indicates the rise edge of s101, which is an input side clock signal clk1, whilst each of T101 to T111 indicates a time interval from one rising edge to the next rising edge. The timing chart of FIGS. 10a to 10h indicates a case where the frequency of the input side clock signal clk1 is ca. 38000 Hz, the frequency of the output side clock signal clk2 is 44100 Hz and the update notification signal s116 has become active at the timing t100 in a time interval T101 in FIG. 10.

Since the update notification signal s116, shown in FIG. 10b, is active at the rise time t101 of the clock signal for the time interval T102, the register 110 takes in the value of a predicted frequency s117. Since the predicted frequency s117, output from the frequency detection unit 2, is "38000", this "38000" is saved as a value in the register 110 (FIG. 10c). In similar manner, the register 111 takes in the value of the measured actual frequency s118 of the output side clock signal clk2. Since the measured actual frequency s118 of the output side clock signal clk2, output from the frequency detection unit 2, is "44100", this "44100" is saved as a value in the register 111 (FIG. 10d).

During the time interval T103, the selector 108 selects s112, out of two input signal, to output the value as s110. The adder 106 is supplied with the value of the signal s110, output from the selector 108, whilst the register 104 takes in an output of the adder 106 as a cumulative sum value. Similarly to the register 104, the register 105 takes in an output from the adder 106 as a cumulative sum value. At this timing, the relationship:

output s107 of register 104<output s106 of register 105 holds (FIGS. 10e and 10f). At this time, the hold flag s104, output from the AND gate 115, becomes active (FIG. 10g).

Since the hold flag s104 is active at a timing t103 of the time interval T104, the selector 109 has selected the signal s115, as a result of which the output s106 of the register 105 for cumulative addition becomes equal to that for T103. The register 104 takes in the value of the signal s108 of the adder 106. As from time interval T105 until time interval T109, the registers 104 and 105 take in the output s108 of the adder 106 and the output s109 of the adder 107.

During the time interval T110, the relationship:

output s107 of register 104<output s106 of register 105 holds for this timing (FIGS. 10e and 10f). Consequently, the hold flag s104, output at this time from the AND gate 115, is active (FIG. 10g).

Since the hold flag s104 is active at the timing of t109 of the time interval T110, the selector 109 has selected the signal s115, as a result of which the output s106 of the register 105 for cumulative addition becomes equal to that for T110. The register 104 takes in the value of the output s108 of the adder 106. As from time interval T111 until the hold flag s104 or the disable flag s105 becomes active, the registers 104 and 105 take in the output s108 of the adder 106 and the output s109 of the adder 107. The same sequence of operations is then repeated.

By the above-described configuration of the fs conversion calculating unit 1 and the circuit operation, it becomes possible to generate a hold flag (or a disable flag) which becomes active at a timing suited for conversion from the input side sampling rate to the output side sampling rate, based on the predicted frequency output from the frequency detection unit 2 and on the actual measured frequency of the output side clock signal clk2. The so generated hold flag or the disable flag is output to the FIFO 3, which FIFO 3 reads out/writes input data, based on the hold flag (or the disable flag) to provide for sampling rate conversion to a high accuracy.

Figure 11:
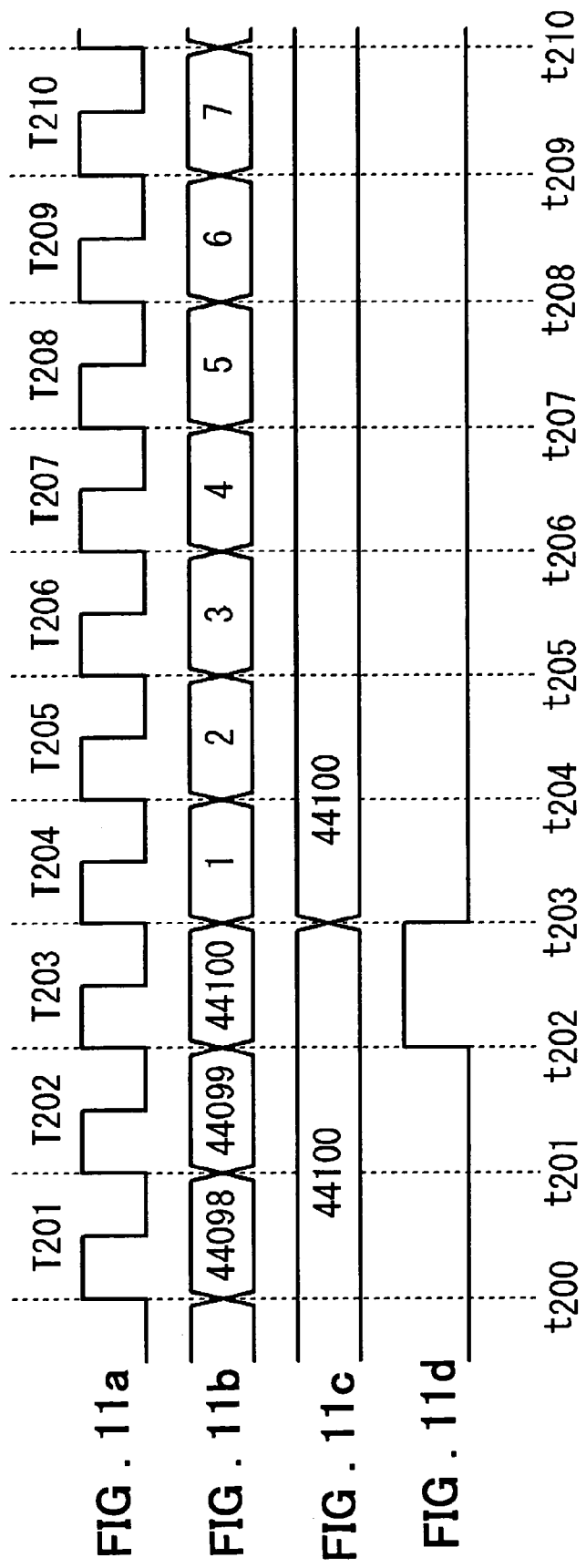
FIGS. 11a, 11b, 11c and 11d are timing charts showing the operation of the frequency detection unit.
Figure 12:
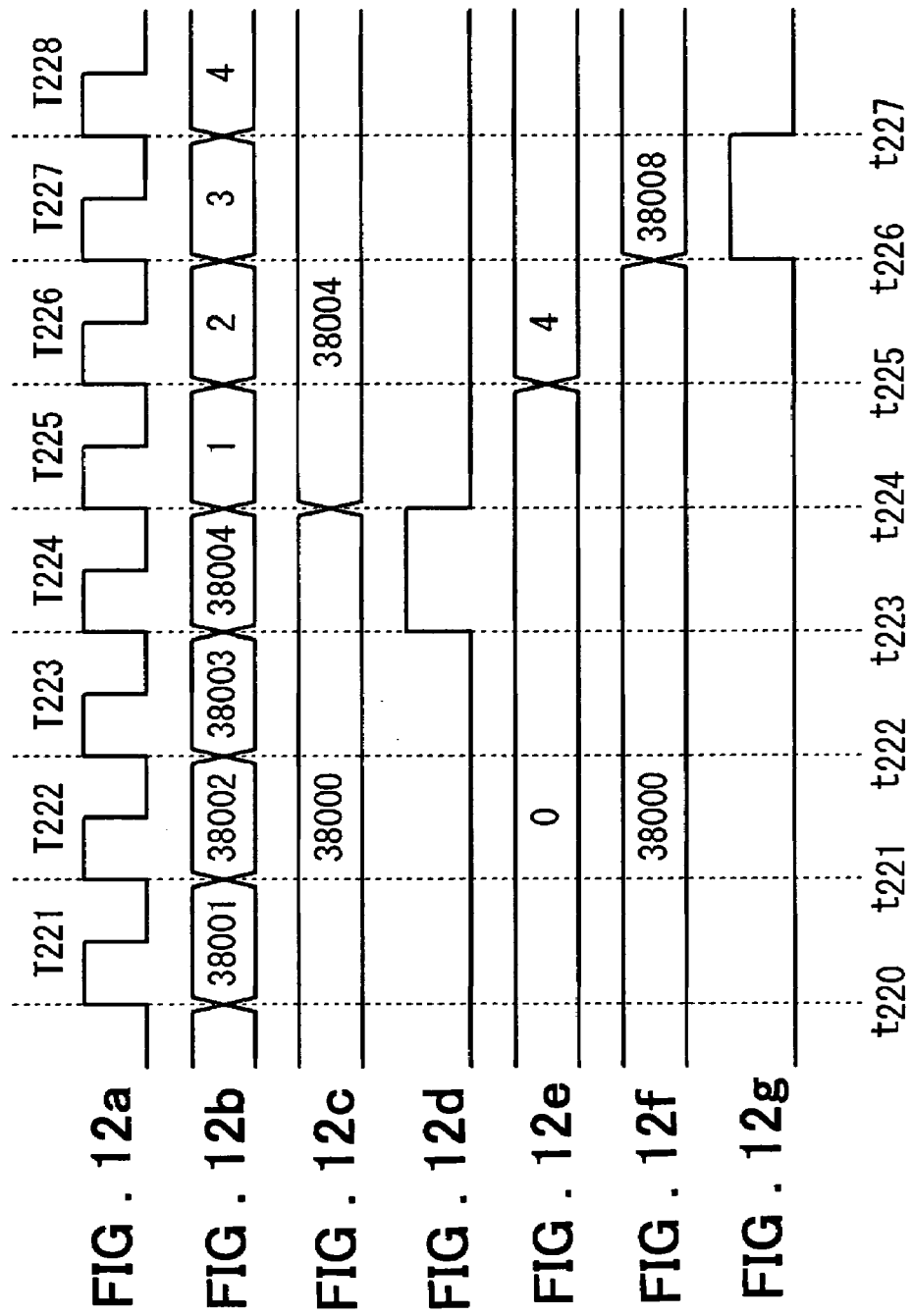
FIGS. 12a, 12b, 12c, 12d, 12e, 12f and 12g, continuing to FIGS. 11a-11d, are timing charts showing the operation of the frequency detection unit.

FIGS. 11 and 12 are timing charts showing the operation of the circuit shown in FIG. 8. FIG. 11a shows how the output side clock signal clk2 is changed. FIG. 11b shows how the output 217 of the counter 216 is changed. FIG. 11c shows how an output s203 of the register 215 is changed. FIG. 11d shows how the coincidence detection signal s216, output from the comparator circuit 213, is changed.

Each of t200 to t210 indicates the rising edge of s219, which is the output side clock signal clk2, whilst each of T201 to T211 indicates the time interval from one rising edge to the next rising edge. The timing chart of FIGS. 11a to 11d indicates a case where the frequency of the input side clock signal clk1 is ca. 38000 Hz, the frequency of the output side clock signal clk2 is 44100 Hz and both the value of the measurement period setting signal s218 and the value held by the register 214 are 44100.

As from time interval T201 until time interval T202, the counter output s217 of the counter 216 is incremented by one with the rising edges t200, t201 of the clock signal. In the time interval T203, the counter output s217 is incremented, with the value thereof being 44100. Since the output signal s215 of the register 214 coincides with the value of the counter output s217, in this manner, the coincidence detection signal s216 becomes active (FIG. 11d).

Since the coincidence detection signal s216 is active at a timing of t203 of the time interval T204, the value of the counter output s217 reverts to 1. The value 44100 of the counter output s217 is also taken into the register 217. As from the time interval T205, the counter output s217 is incremented by one with each rising edge of the clock signal until the value thereof coincides with the value of s215. The same sequence of operations is then repeated.

FIG. 12a shows how the input side clock signal clk1 is changed. FIG. 12a shows how the counter output s213 of the counter 208 is changed. FIG. 12b shows how the counter output s213 is changed.

FIG. 12c shows how the output s206 of the register 207 is changed.

FIG. 12d shows how the coincidence detection signal s212, output from the clock synchronization circuit 212, is changed. FIG. 12e shows how the output s211 from the register 204 is changed. FIG. 12f shows how the output s202 from the register 201 is changed. FIG. 12g shows how the output s202 of the register 209 is changed.

Each of t220 to t227 indicates a rising edge of s214 which is the input side clock signal clk1. Each of T221 to T228 indicates a time interval from one rising edge to the next rising edge. The timing chart of FIGS. 12a to 12g indicates a case where the frequency of the input side clock signal clk1 is ca. 38000 Hz, the frequency of the output side clock signal clk2 is 44100 Hz and both the value of the measurement period setting signal s218 and the value held by the register 214 are 44100.

As from time interval T221 until time interval T223, the counter output s213 of the counter 208 is incremented by one with each of the rising edges t220 to t222 of the clock signal (FIG. 12b). For time interval T224, the coincidence detection signal s212, synchronized with the input side clock signal clk1 (FIG. 12d) becomes active at a timing of t223. At this time, the counter output s213 is incremented, its value then being 38004 (FIG. 12b).

Since the coincidence detection signal s212, synchronized with the input side clock signal clk1, was active at a timing of t224 of the time interval T225, the value of the counter output s213 reverts to 1 (FIG. 12b). The value of the counter output s213 (38004) is taken in by the register 207 (FIG. 12c). During the time interval T226, a calculated value of the cumulative error is stored in the register 204, with the output signal s211 of the register 204 indicating the value of a new cumulative error (4) (FIG. 2e). At this timing, the counter output s213 is also incremented.

For the time interval T227, the value of the predicted frequency s201 (38008) is calculated from the value of the cumulative error updated during the time interval T226 (FIG. 12f). At the same timing, the conversion notification signal s202 is activated (FIG. 12g). At this timing, the counter output s213 is also incremented. As from the time interval T228, the counter output s213 is incremented by one with each rising edge of the clock signal. By the configuration of the frequency detection unit 2 and the circuit operation, described above, the frequency detection unit 2 generates the predicted frequency from the measured actual frequency. The predicted frequency is the calculated values of the frequency of the input side clock signal clk1 and the frequency of the output side clock signal clk2, as dynamically varied depending on the temperature drift or on oscillator jitter characteristics, and as seasoned with the values of the cumulative error up to the time. The frequency detection unit 2 outputs the predicted frequency to the fs conversion calculating unit 1, which fs conversion calculating unit 1 then executes calculations for sampling rate conversion, based on the predicted frequency, and on the actual measured frequency obtained on actually measuring the output side clock signal clk2. The sampling rate conversion may be executed to a high accuracy as the cumulative error approaches to zero, such that the predicted frequency approaches to the measured actual frequency.

Figure 13:
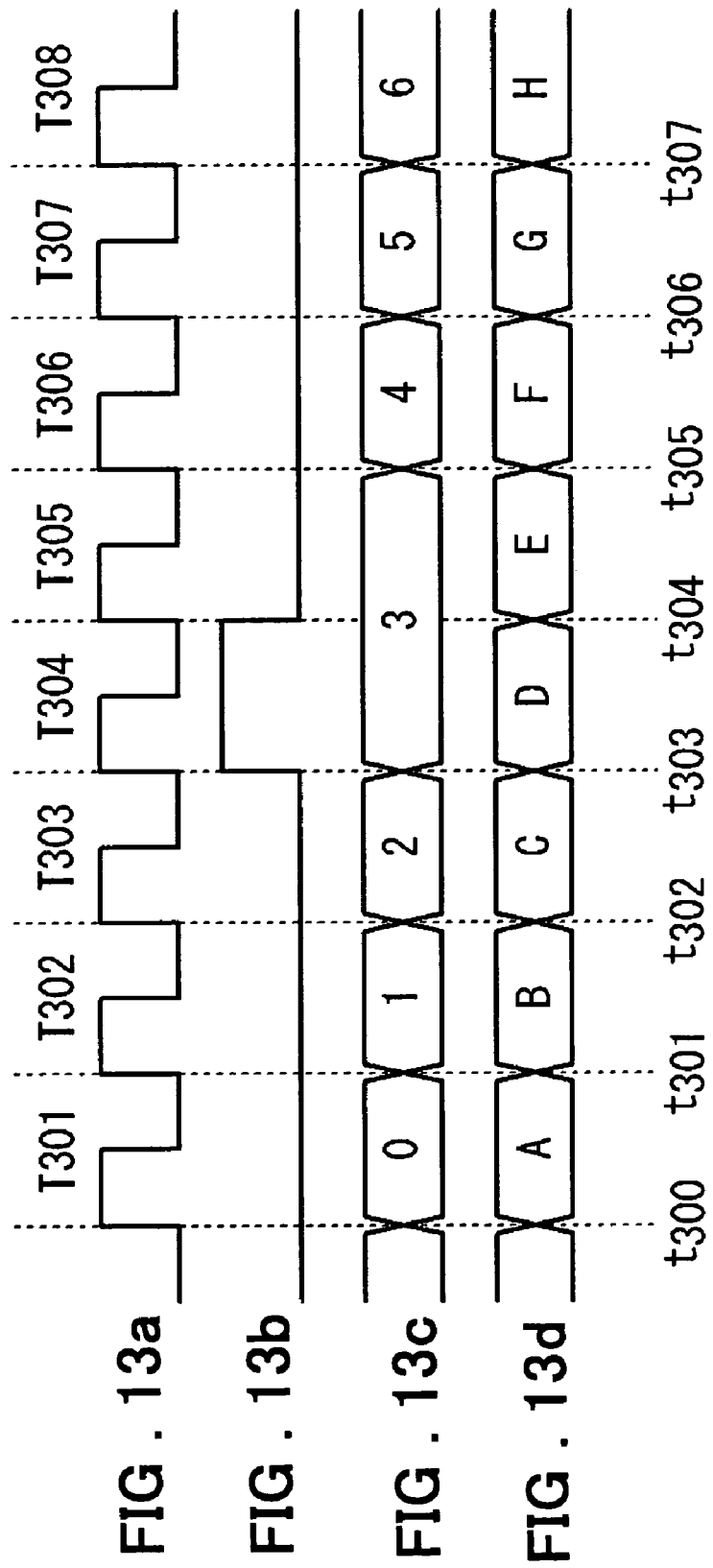
FIGS. 13a, 13b, 13c and 13d are timing charts showing the operation of the FIFO.
Figure 14:
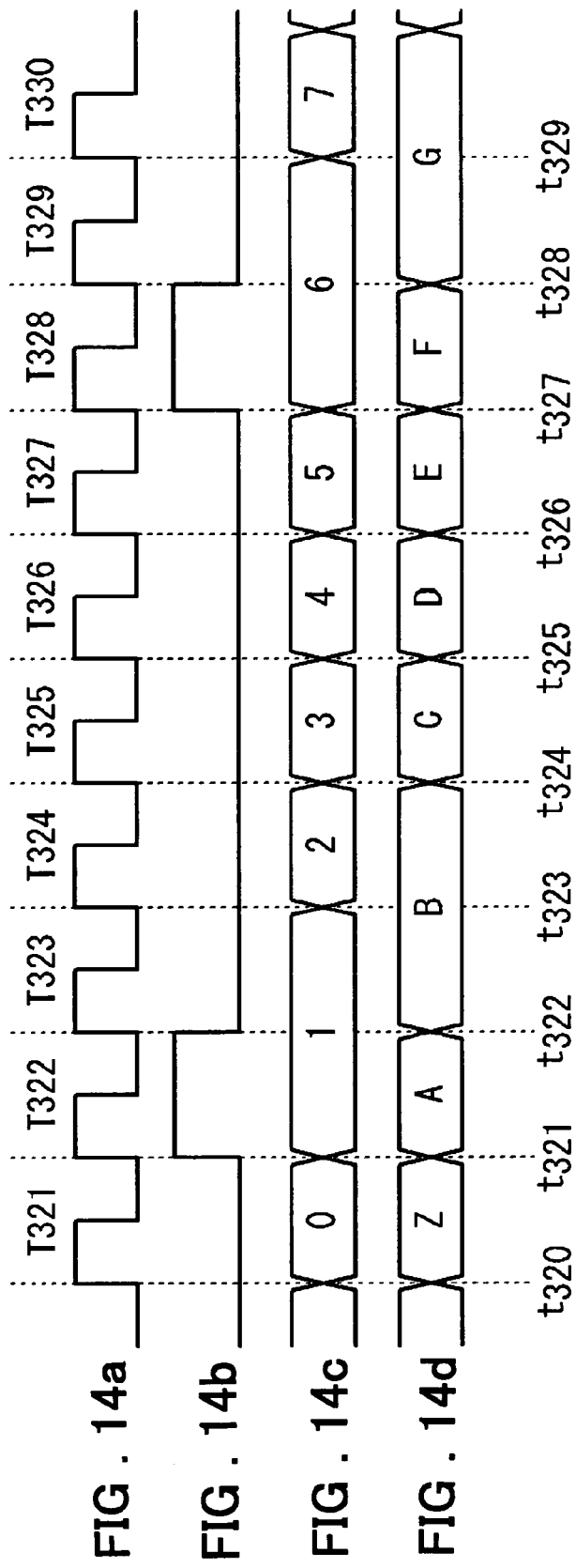
FIG. 14a, 14b, 14c and 14d are timing charts showing the operation of the FIFO.

FIGS. 13 and 14 are timing charts showing the operation of the circuit shown in FIG. 9. FIGS. 13*a* to 13*d* show the operation of writing data in the RAM 301. Specifically, FIG. 13*a* shows how the input side clock signal clk1 is changed. FIG. 13*b* shows how the disable flag s304 is changed. FIG. 13*c* shows how a write pointer s305, output from the register 302, is changed. FIG. 13*d* shows how the speech data s301 is changed.

Each of t300 to t307 indicates a rising edge of s314 which is the input side clock signal clk1, whilst each of T301 to T308 indicates the time interval as from one rising edge to the next rising edge thereof. The timing chart of FIGS. 13*a* to 13*d* indicates a case where the frequency of the input side clock signal clk1 is ca. 38000 Hz and the frequency of the output side clock signal clk2 is 44100 Hz. It is assumed, as an example, that the RAM 301 shown in FIG. 9 is such a memory supplied at the same timing with write addresses and with write data during write time and which outputs read data after one clock after being supplied with a read address during read time.

As from the time interval T301 until time the time interval T303, the write pointer s305 is incremented in synchronism with the input side clock signal clk1. The speech data s301 is changed each clock to write speech data in an address indicated by the write pointer s305 (FIGS. 13*c* and 13*d*). During data write, the signal s302, corresponding to the speech data s301, the MSB side of which is added by the hold flag 303, is written in the RAM 301.

Such a case in which the disable flag s304 becomes active at a timing t303 of the time interval T304 is taken as an example for explanation. At this timing, the write pointer s305 is incremented, and the value of the speech data s301 is changed from that for the directly previous time interval T304. Specifically, the speech data C is written in an address 2 indicated by the write pointer s305, and the speech data are written in an address 3 indicated by a write pointer s305.

During the time T305, the disable flag s304 is active for the rising edge t304. Hence, the write pointer s305 is not incremented, such that a value which is the same as that for T304 is output. The write operation is carried out in the RAM 301 and the write pointer s305 is not incremented, so that speech data E is overwritten in the same address where the speech data D has been written during T304.

As from T306 until T308, the write pointer s305 is incremented in synchronism with the input side clock signal clk1. The speech data s301 is changed every clock and speech data is written in an address indicated by the write pointer s305 (FIGS. 13*c* and 13*d*). For data writing, the signal corresponding to the speech data s301, the MSB side of which is added by the hold flag 303, is written in the RAM 301. The same sequence of operations is then repeated.

FIGS. 14*a* to 14*d* show the operation of reading out data from the RAM 301. FIG. 14*a* shows how the output side clock signal clk2 is changed, whilst FIG. 14*b* shows how the hold flag s311, output from the RAM 301, is changed. FIG. 14*c* shows how the read pointer s310, output from the register 305, is changed, whilst FIG. 14*d* shows how the speech data s309, output from the RAM 301, is changed.

Each of t320 to t329 indicates a rise edge of s315, which is the output side clock signal clk2, whilst each of T321 to T330 indicates the time interval as from a given rising edge to the next rising edge. The timing chart of FIGS. 14*a* to 14*d* indicates a case where the frequency of the input side clock signal clk1 is ca. 38000 Hz and the frequency of the output side clock signal clk2 is 44100 Hz. It is assumed, as an example, that the RAM 301 shown in FIG. 9 is such a memory supplied at the same timing with write addresses and with write data during write time and which outputs read data after one clock after being supplied with a read address during read time.

During the time interval T321, the read pointer s310 is incremented (FIG. 14*c*). From the RAM 301, data stored in the address indicated by a read pointer one clock before is output as s308 (FIG. 14*d*). During the time interval T322, the read pointer s310 is incremented and new data is output as data signal s308. FIG. 14*b* shows a case where the signal s311 of the MSB part of the data signal s308, output from the RAM 301 during this time interval T322, is equal to 1.

Since the signal s311 was 1 at the timing of t322 for the time interval T323, the read pointer 310 is not incremented (FIG. 14*c*). Since the read pointer s310 has not been incremented during the time interval T323, the speech output data s309 for the time interval T324 is the same as the value output for the time interval T323 (FIG. 14*d*).

As from the time interval T325 until the time interval T327, the read pointer s310 is incremented. From the RAM 301, data stored in the address indicated by a read pointer one clock before is output as s308. During the time interval T328, the read pointer s310 is incremented and new data is output as data signal s308. FIG. 14*b* shows a case where the signal s311 of the MSB part of the data signal s308, output from the RAM 301 during this time interval T328, is again equal to 1.

Since the signal s311 was 1 at the timing of t328 for the time interval T329, the read pointer 310 is not incremented (FIG. 14*c*). Since the read pointer s310 has not been incremented during the time interval T329, the speech output data s309 for the time interval T329 is the same as the value output for the time interval T329 (FIG. 14*d*). The same sequence of operations is then repeated. By the above operations, the FIFO 3 reads out/writes data entered based on a hold flag (or a disable flag) output from the fs conversion calculating unit 1. The hold flag (or the disable flag) has been generated by the fs conversion calculating unit 1, based on the predicted frequency output from the frequency detection unit 2. The predicted frequency is the calculated values of the frequency of the input side clock signal clk1 and the frequency of the output side clock signal clk2, as dynamically varied depending on the temperature drift or on jitter characteristics of the oscillator, and as seasoned with the values of the cumulative error up to the time. Consequently, the sampling rate conversion may be carried out to high accuracy even in case the output side clock or the input side clock undergoes these variations.

Figure 15:
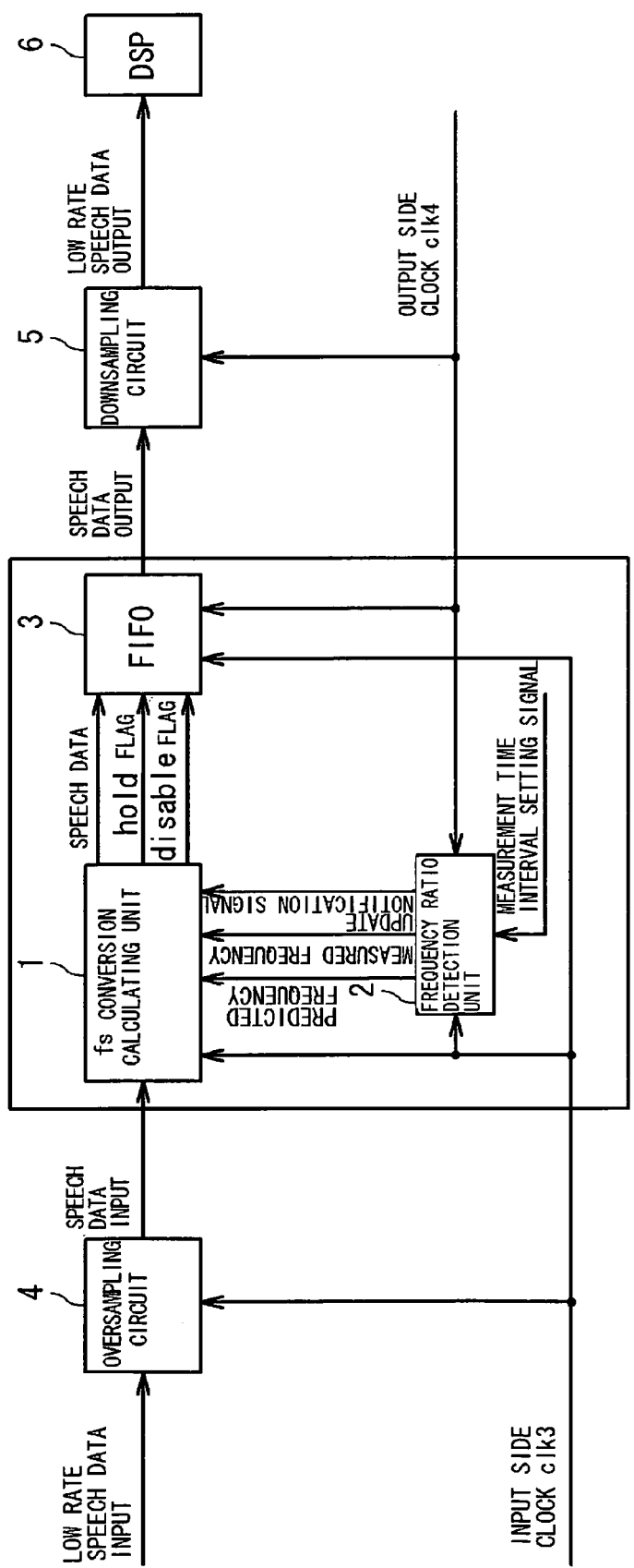
FIG. 15 is a block diagram showing another configuration of the sampling rate conversion apparatus in the best mode of executing the present invention.

FIG. 15 depicts a block diagram showing a modified configuration of a sampling rate conversion apparatus in the best mode for carrying out the invention. Referring to FIG. 15, the present embodiment of the sampling rate conversion apparatus is made up by an fs conversion calculating unit 1, a frequency detection unit 2, a FIFO 3, an oversampling circuit 4, a downsampling circuit 5 and a DSP 6. The sampling rate conversion apparatus, shown in FIG. 15, includes a circuit shown in FIG. 2 and, for achieving rate conversion with a higher sound quality, includes an oversampling circuit 4 (interpolator) and a downsampling circuit 5 (decimeter). An output of the downsampling circuit 5 is entered to a DSP (digital signal processor) 6.

Since the fs conversion calculating unit 1, frequency detection unit 2 and the FIFO 3 are configured similarly to the equivalent parts shown in FIG. 2, the corresponding explanation therefor is omitted for simplicity. The oversampling circuit 4 is so designed that, by increasing the sampling points of the digital signal, the digital signal may approach to an analog signal to decrease the deterioration of the sound quality otherwise caused by sampling rate conversion. Sampling is carried out at a frequency equal to a preset multiple frequency with respect to the sampling rate of the input speech data. The setting of the multiple may be changed optionally. The downsampling circuit 5 is a decimeter for re-sampling speech data, sampled at a higher frequency, with a low frequency obtained on frequency division of the an output side clock signal clk4. With this sampling rate conversion apparatus, it is possible to realize sampling rate conversion suffering from deterioration of the sound quality to a lesser extent.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A sampling rate conversion apparatus for converting first data, sampled at a first sampling rate, into second data, sampled at a second sampling rate, said apparatus comprising:
    a FIFO for storing said first data responsive to a first clock signal and for outputting said first data as second data responsive to a second clock signal, said FIFO storing said first data based on a write control signal indicating whether or not said first data written directly previously is to be updated to said first data; said FIFO outputting the second data read out based on a read control signal indicating whether or not the second data as read out is to be read out during a next time interval as well; and
    a calculating unit for generating the write control signal and the read control signal from a value of a second current clock frequency for a current time interval and from a value of a current predicted clock frequency to output the write control signal and the read control signal value thus generated to said FIFO, wherein
    the value of said second current clock frequency value comprises a measured value of said second clock signal for the current time interval, and
    wherein the value of said current predicted clock frequency represents a predicted value of the frequency of said first clock signal during the current time interval.

2. The sampling rate conversion apparatus according to claim 1, wherein the value of the first current clock frequency is generated by measuring said second clock signal during said current time interval in place of said first clock signal; the value of the current predicted clock frequency is generated from the value of said first current clock frequency and from a value of a directly previously predicted clock frequency, with the value of the current predicted clock frequency being used as the value of said directly previously predicted clock frequency during the next time interval;
    said calculating unit generating said write control signal and said read control signal from the value of a second current clock frequency, generated by measuring said first clock signal in place of said first clock signal during said current period, and from the value of said current predicted clock frequency; said calculating unit outputting the write control signal and the read control signal thus generated to said FIFO.

3. The sampling rate conversion apparatus according to claim 1, wherein said FIFO includes a write pointer and a read pointer;
    said write pointer being incremented when said first data is stored in an area specified by said write pointer; said read pointer being incremented when said second data is read out from an area specified by said write pointer;
    said write control signal controlling an inhibition of incrementing of said write pointer;
    said read control signal controlling an inhibition of incrementing of said read pointer.

4. The sampling rate conversion apparatus according to claim 1, wherein a time interval of said current time interval, as a frequency measurement time interval, is shorter and longer for said first clock signal anticipated to be larger than a preset value, and for said first clock signal anticipated to be larger and smaller than said preset value, respectively.

5. A sampling rate conversion apparatus for converting first data, sampled at a first sampling rate, into second data, sampled at a second sampling rate, comprising:
    a FIFO for storing said first data responsive to a first clock signal and for outputting said first data as second data responsive to a second clock signal, said FIFO storing said first data based on a write control signal indicating whether or not said first data written directly previously is to be updated to said first data; said FIFO outputting the second data read out based on a read control signal indicating whether or not the second data as read out is to be read out during a next time interval as well;
    a frequency detection unit for measuring said a first clock signal during a current time interval for generating a value of a first current clock frequency, said frequency detection unit also generating a value of a current predicted clock frequency from the value of said first current clock frequency and from a value of a directly previously predicted clock frequency, said frequency detection unit employing the value of said current predicted clock frequency as the value of said directly previously predicted clock frequency for the next time interval; and
    a calculating unit for generating said write control signal and said read control signal from a value of a second current clock frequency, generated by measuring said second clock signal during said current time interval, and from the value of said current predicted clock frequency, said calculating unit outputting the write control signal and the read control signal thus generated to said FIFO.

6. The sampling rate conversion apparatus according to claim 5, wherein the value of the first current clock frequency is generated by measuring said second clock signal during said current time interval in place of said first clock signal; the value of the current predicted clock frequency is generated from the value of said first current clock frequency and from the value of the directly previously predicted clock frequency, with the value of the current predicted clock frequency being used as the value of said directly previously predicted clock frequency during the next time interval;
    said calculating unit generating said write control signal and said read control signal from the value of a second current clock frequency, generated by measuring said first clock signal in place of said first clock signal during said current period, and from the value of said current predicted clock frequency; said calculating unit outputting the write control signal and the read control signal thus generated to said FIFO.

7. The sampling rate conversion apparatus according to claim 5, wherein said FIFO includes a write pointer and a read pointer;
said write pointer being incremented when said first data is stored in an area specified by said write pointer; said read pointer being incremented when said second data is read out from an area specified by said write pointer;
said write control signal controlling an inhibition of incrementing of said write pointer;
said read control signal controlling an inhibition of incrementing of said read pointer.

8. The sampling rate conversion apparatus according to claim 5, wherein said frequency detection unit determines a current cumulative error, as a cumulative error up to the current time, based on a difference between the value of the directly previously predicted clock frequency and the value of said first current clock frequency, and on said directly previous cumulative error.

9. The sampling rate conversion apparatus according to claim 8, wherein said frequency detection unit during said current period updates said directly previous cumulative error to said current cumulative error;
said current cumulative error being used during the next time interval as said directly previous cumulative error.

10. The sampling rate conversion apparatus according to claim 5, wherein said frequency detection unit determines the value of said current predicted clock frequency based on the value of said first current clock frequency and said current cumulative error multiplied by k ($0<k\leq 1$).

11. The sampling rate conversion apparatus according to claim 10, wherein said k is a parameter for controlling the rate at which the value of said current predicted clock frequency approaches to a value of said first current clock frequency; and wherein
said frequency detection unit determines a value of k based on a degree of variation of the clock frequency.

12. A sampling rate conversion method for converting, in a clocked system, first data, sampled at a first sampling rate, into second data, sampled at a second sampling rate, said method comprising:
storing said first data responsive to a first clock signal in a FIFO (storage) unit;
outputting said first data as second data responsive to said a second clock signal;
storing said first data, written directly previously, based on a write control signal indicating whether or not said first data is to be updated to said first data in a FIFO (storage) unit;
reading out the second data based on a read control signal indicating whether or not said second data as read out is to be read out for a next time interval as well; and
generating said write control signal and said read control signal from a value of a second current clock frequency, as a measured value of a frequency of said second clock signal for a current time interval, and from a value of a current predicted clock frequency representing a predicted value of a frequency of said first clock signal.

13. The sampling rate conversion method according to claim 12, further comprising:
measuring said second clock signal in place of said first clock signal during said current time interval to generate a value of a first current clock frequency;
generating the value of a current predicted clock frequency from the value of said first current clock frequency and from the value of the directly previously predicted clock frequency;
setting the value of said current predicted clock frequency as the value of said directly previously predicted clock frequency during the next time interval; and
generating said write control signal and said read control signal from the value of the second clock frequency value, generated by measuring said first clock signal during said current time interval in place of said second clock signal, and from the value of said current predicted clock frequency, to output the so generated write control signal and read control signal.

14. The sampling rate conversion method according to claim 12, comprising:
incrementing said write pointer when said first data is stored in an area specified by a write pointer;
incrementing said read pointer when said second data is read out from an area specified by a read pointer;
controlling an inhibiting of incrementing of said write pointer by said write control signal; and
controlling an inhibiting of incrementing of said read pointer by said read control signal.

15. The sampling rate conversion method according to claim 12, wherein the time interval of said current time interval, as a frequency measurement time interval, is shorter for said first clock signal anticipated to be larger than a preset value, and is longer for said first clock signal anticipated to be smaller than said preset value.

16. The sampling rate conversion method according to claim 12, wherein a current cumulative error, as the cumulative error up to the current time, is determined based on a difference between the value of the directly previously predicted clock frequency and the value of said first current clock frequency, and on said cumulative error.

17. The sampling rate conversion method according to claim 16, further comprising the steps of:
updating said cumulative error to said current cumulative error during said current period; and
using said current cumulative error during the next current time interval as said cumulative error.

18. The sampling rate conversion method according to claim 12, wherein the value of said current predicted clock frequency is determined based on the value of said first current clock frequency and said current cumulative error multiplied by k ($0<k\leq 1$).

19. The sampling rate conversion method according to claim 18, wherein the value of k is a parameter for controlling a rate at which the value of said current predicted clock frequency approaches to the value of said first current clock frequency;
said value of k being determined based on a degree of variation of the clock frequency.

20. A sampling rate conversion method for converting, in a clocked system, first data, sampled at a first sampling rate, into second data, sampled at a second sampling rate, said method comprising:
storing said first data responsive to a first clock signal in a FIFO (storage) unit;
outputting said first data as second data responsive to said a second clock signal;
storing said first data, written directly previously, based on a write control signal indicating whether or not said directly previously written first data is to be updated to said first data in a FIFO (storage) unit;

reading out the second data based on a read control signal indicating whether or not said second data as read out is to be read out during a next time interval as well, and outputting the so read out second data;

measuring said first clock signal during a current time interval to generate a value of a first current clock frequency;

generating a value of a current predicted clock frequency from the value of said first current clock frequency and from a value of the directly previously predicted clock frequency;

employing the value of said current predicted clock frequency during the next time interval as the value of said directly previously predicted clock frequency; and generating said write control signal and the read control signal from a value of a second current clock frequency, generated by measuring said a second clock signal during the current time interval, and from the value of the current predicted clock frequency.

21. The sampling rate conversion method according to claim 20, further comprising:

measuring said second clock signal in place of said first clock signal during said current time interval to generate the value of the first current clock frequency;

generating the value of a current predicted clock frequency from the value of said first current clock frequency and from the value of the directly previously predicted clock frequency;

setting the value of said current predicted clock frequency as the value of said directly previously predicted clock frequency during the next time interval; and generating said write control signal and said read control signal from the value of the second clock frequency value, generated by measuring said first clock signal during said current time interval in place of said second clock signal, and from the value of said current predicted clock frequency, to output the so generated write control signal and read control signal.

22. The sampling rate conversion method according to claim 20, comprising:

incrementing said write pointer when said first data is stored in an area specified by a write pointer;

incrementing said read pointer when said second data is read out from an area specified by a read pointer;

controlling an inhibiting of incrementing of said write pointer by said write control signal; and controlling an inhibiting of incrementing of said read pointer by said read control signal.

23. A sampling rate conversion apparatus for writing data to a memory responsive to an input clock signal and for reading and outputting the data written to the memory responsive to an output clock signal, said apparatus comprising:

a calculation circuit for generating a control signal based on a difference between a cumulatively added predictive frequency of the input clock signal and a cumulatively added frequency of the output clock signal; and a control circuit, receiving said control signal, for controlling to update a read pointer and a write pointer for the memory, responsive to said control signal.

24. The sampling rate conversion apparatus according to claim 23, wherein said calculation circuit outputs, as said control signal, a first control signal if a value obtained on cumulatively adding the predictive frequency of the input clock signal is more than a value obtained on said cumulatively adding the frequency of the output clock signal, while said calculation circuit outputs, as said control signal, a second control signal if the value obtained on cumulatively adding the predictive frequency of the input clock signal is not more than the value obtained on cumulatively adding the frequency of the output clock signal.

25. The sampling rate conversion apparatus according to claim 24, wherein said control circuit, on receipt of said first control signal output from said calculation circuit, performs control so as to write data to the memory without updating the write pointer, wherein said control circuit, on receipt of said second control signal output from said calculation circuit, performs control so as to read data from the memory without updating the read pointer.

26. The sampling rate conversion apparatus according to claim 24, further comprising a frequency ratio detection circuit for comparing the cumulatively added value of the predictive frequency of the input clock signal with the cumulatively added value of the frequency of the output clock signal, wherein said frequency ratio detection circuit, in case of the cumulatively added value of the frequency of the output clock signal being more than the cumulatively added value of the predictive frequency of the input clock signal and adds a predictive frequency value of the input clock signal to the cumulatively added value of the predictive frequency of the input clock signal to update the cumulatively added value of the frequency of the input clock signal.

27. The sampling rate conversion apparatus according to claim 23, further comprising an oversampling circuit, the oversampling circuit configured to increase sampling points of the input signal at a frequency equal to a preset multiple frequency with respect to a sampling rate of an input speech data.

28. The sampling rate conversion apparatus according to claim 27, further comprising a downsampling circuit, the downsampling circuit configured to re-sample speech data, the resampled speech data being sampled at a lower frequency than the input signal sampling rate.

29. The sampling rate conversion apparatus of claim 23, wherein a measurement time interval is set so as to be longer in case an error between an actual frequency and a predictive frequency of the input clock signal is predicted to be small.

* * * * *